(12) United States Patent
Min et al.

(10) Patent No.: US 10,000,695 B2
(45) Date of Patent: Jun. 19, 2018

(54) METHOD OF MANUFACTURING FLUORIDE PHOSPHOR, WHITE LIGHT EMITTING APPARATUS, DISPLAY APPARATUS, AND LIGHTING DEVICE

(71) Applicants: Chan Suk Min, Suwon-si (KR); Tae Hoon Kim, Suwon-si (KR); Jong Won Park, Seoul (KR); Ji Ho You, Seoul (KR); Jeong Rok Oh, Suwon-si (KR); Chul Soo Yoon, Suwon-si (KR); In Hyung Lee, Hanam-si (KR); Chi Woo Lee, Cheonan-si (KR)

(72) Inventors: Chan Suk Min, Suwon-si (KR); Tae Hoon Kim, Suwon-si (KR); Jong Won Park, Seoul (KR); Ji Ho You, Seoul (KR); Jeong Rok Oh, Suwon-si (KR); Chul Soo Yoon, Suwon-si (KR); In Hyung Lee, Hanam-si (KR); Chi Woo Lee, Cheonan-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 209 days.

(21) Appl. No.: 14/981,887

(22) Filed: Dec. 28, 2015

(65) Prior Publication Data
US 2016/0186053 A1    Jun. 30, 2016

(30) Foreign Application Priority Data

Dec. 26, 2014    (KR) .................... 10-2014-0190518

(51) Int. Cl.
*C09K 11/61* (2006.01)
*C09K 11/02* (2006.01)
*B08B 3/12* (2006.01)
*B05D 1/18* (2006.01)
*H01L 33/00* (2010.01)

(52) U.S. Cl.
CPC .......... *C09K 11/617* (2013.01); *C09K 11/025* (2013.01); *H01L 33/00* (2013.01); *H01L 2224/48137* (2013.01); *H01L 2224/73265* (2013.01); *H01L 2924/181* (2013.01); *Y02B 20/181* (2013.01)

(58) Field of Classification Search
CPC ............................. C09K 11/617; C09K 11/025
See application file for complete search history.

(56) References Cited

U.S. PATENT DOCUMENTS

| 6,242,043 B1 | 6/2001 | Lipp |
| 6,372,608 B1 | 4/2002 | Shimoda et al. |

(Continued)

FOREIGN PATENT DOCUMENTS

| EP | 2774966 | * | 9/2014 |
| EP | 2774966 A1 | | 9/2014 |

(Continued)

*Primary Examiner* — C Melissa Koslow
(74) *Attorney, Agent, or Firm* — Renaissance IP Law Group LLP

(57) ABSTRACT

A method of manufacturing a fluoride phosphor, the method comprising: preparing a hydrofluoric (HF) solution in which a first source material and a fluoride containing $Mn^{4+}$ are dissolved; and forming fluoride particles by introducing a second source material to the HF solution in each of a plurality of instances.

18 Claims, 20 Drawing Sheets

(56) References Cited

U.S. PATENT DOCUMENTS

| | | |
|---|---|---|
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,847,309 B2 | 12/2010 | Radkov et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,057,706 B1 * | 11/2011 | Setlur .................... C09K 11/02 252/301.4 F |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 8,829,781 B2 | 9/2014 | Masuda et al. |
| 2005/0017217 A1 | 1/2005 | Moon et al. |
| 2012/0256125 A1 | 10/2012 | Kaneyoshi et al. |
| 2012/0305972 A1 | 12/2012 | Meyer et al. |
| 2013/0015651 A1 | 1/2013 | Lau et al. |
| 2013/0022758 A1 * | 1/2013 | Trottier .............. C09K 11/7774 427/565 |
| 2013/0193472 A1 | 8/2013 | Winkler et al. |
| 2013/0271960 A1 | 10/2013 | Hong et al. |
| 2014/0231857 A1 | 8/2014 | Nammalwar et al. |
| 2015/0035430 A1 * | 2/2015 | Yoshida ................ H01L 33/502 313/503 |

FOREIGN PATENT DOCUMENTS

| | | |
|---|---|---|
| JP | 201314715 | 1/2013 |
| JP | 5446511 | 3/2014 |
| JP | 5545665 | 7/2014 |
| JP | 2014141684 | 8/2014 |
| KR | 100526343 | 11/2005 |
| KR | 101330862 | 11/2013 |
| WO | 2009119486 A1 | 10/2009 |

* cited by examiner

US 10,000,695 B2

METHOD OF MANUFACTURING FLUORIDE PHOSPHOR, WHITE LIGHT EMITTING APPARATUS, DISPLAY APPARATUS, AND LIGHTING DEVICE

CROSS-REFERENCE TO RELATED APPLICATION

This application claims the priority and benefit of Korean Patent Application No. 10-2014-0190518 filed on Dec. 26, 2014, with the Korean Intellectual Property Office, the disclosure of which is incorporated herein by reference.

BACKGROUND

Embodiments relate to a method of manufacturing a fluoride phosphor, a white light emitting apparatus, a display apparatus, and a lighting device.

Semiconductor light emitting devices emit light using the principle of electron-hole recombination when a current is applied thereto, and due to various inherent advantages thereof, such as low power consumption, high luminance, and compactness, semiconductor light emitting devices have commonly been used as light sources. In particular, since the development of nitride-based light emitting devices, semiconductor light emitting devices have been extensively utilized and employed in backlight units, household lighting devices, vehicle lighting, and the like.

A light emitting apparatus using such a semiconductor light emitting device may have a light emitting device providing excitation light and a phosphor excited by light emitted from the light emitting device to emit wavelength-converted light, thus realizing desired color characteristics.

SUMMARY

An embodiment includes a method of manufacturing a fluoride phosphor, the method comprising: preparing a hydrofluoric (HF) solution in which a first source material and a fluoride containing $Mn^{4+}$ are dissolved; and forming fluoride particles by introducing a second source material to the HF solution in each of a plurality of instances.

An embodiment includes a method of manufacturing a fluoride phosphor, the method comprising: preparing a hydrofluoric (HF) solution in which a first source material and a fluoride containing $Mn^{4+}$ are dissolved; forming fluoride particles by introducing a second source material to the HF solution; cleaning the fluoride particles; and removing fine powder from surfaces of the fluoride particles.

An embodiment includes a method of manufacturing a fluoride phosphor, the method comprising: preparing a hydrofluoric (HF) solution in which a first source material and a fluoride containing Mn4+ are dissolved; forming fluoride particles by introducing a second source material to the HF solution where one of the first and second source materials remains after the fluoride particles are formed; and additionally introducing the other of the first and second source materials to the HF solution in which the fluoride particles have been formed, to coat the fluoride particles with an Mn-free fluoride.

BRIEF DESCRIPTION OF DRAWINGS

The above and other aspects, features and advantages will be more clearly understood from the following detailed description taken in conjunction with the accompanying drawings, in which.

DETAILED DESCRIPTION

Figure 1:
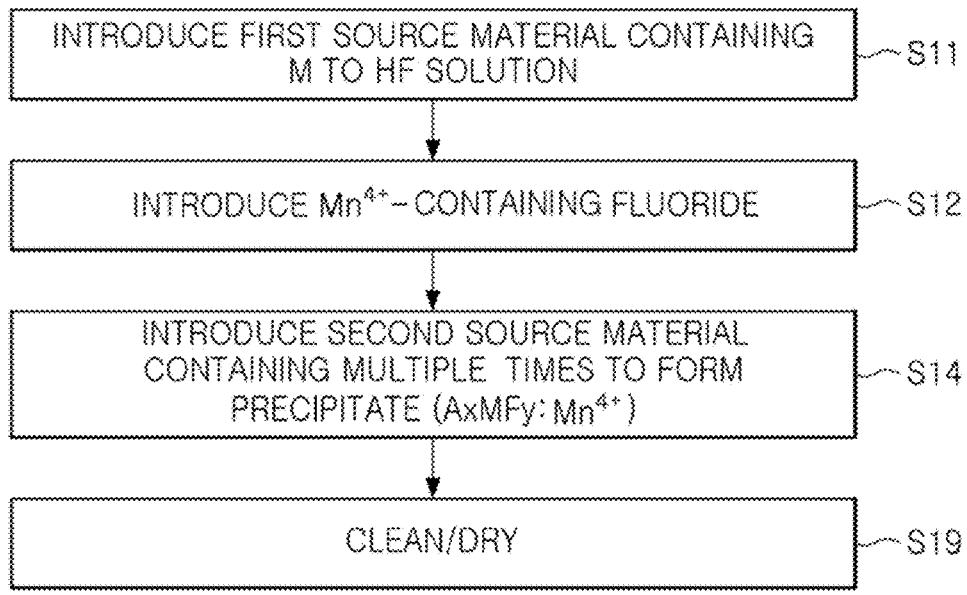
FIG. 1 is a flow chart illustrating a method of manufacturing a fluoride phosphor according to an embodiment (particle size control)

Embodiments will now be described in detail with reference to the accompanying drawings. Embodiments may, however, take many different forms and should not be construed as being limited to the specific embodiments set forth herein. Rather, these embodiments are provided so that this disclosure will be thorough and complete, and will fully convey the scope to those skilled in the art. In the drawings, the shapes and dimensions of elements may be exaggerated for clarity, and the same reference numerals will be used throughout to designate the same or like elements. In this disclosure, terms such as "above", "upper portion", "upper surface", "below", "lower portion", "lower surface", "lateral surface", and the like, are determined based on the drawings, and in actuality, the terms may be changed according to a direction in which a device or an element is disposed.

The expression "an embodiment or one example" used in the present disclosure may, but need not refer to identical examples and is provided to stress different unique features between each of the examples. However, examples provided in the following description are not excluded from being associated with features of other examples and implemented thereafter. For example, even if matters described in a specific example are not described in a different example thereto, the matters may be understood as being related to the other example, unless otherwise mentioned in descriptions thereof.

An embodiment includes a method of manufacturing a fluoride phosphor. The fluoride phosphor may be expressed as $A_xMF_y$:$Mn^{4+}$, by empirical formula and the empirical formula may satisfy the following conditions.

1) A is at least one selected from among Li, Na, K, Rb, and Cs;
2) M is at least one selected from among Si, Ti, Zr, Hf, Ge, and Sn;
3) A compositional ratio (x) of A is $2 \leq x \leq 3$; and
4) A compositional ratio (y) of F is $4 \leq y \leq 7$.

The fluoride phosphor may be excited by a wavelength of light ranging from that of an ultraviolet region to that of a blue region to provide a red light. For example, the fluoride phosphor may absorb excitation light having a peak wavelength ranging from about 300 nm to about 500 nm and emit light having a peak wavelength ranging from about 620 nm to about 640 nm. For example, the fluoride phosphor may include $K_2SiF_6$:$Mn^{4+}$, $K_2TiF_6$:$Mn^{4+}$, $K_2SnF_6$:$Mn^{4+}$, $Na_2TiF_6$:$Mn^{4+}$, $Na_2ZrF_6$:$Mn^{4+}$, $K_3SiF_7$:$Mn^{4+}$, $K_3ZrF_7$:$Mn^{4+}$, or $K_3SiF_5$:$Mn^{4+}$.

Since the fluoride phosphor may realize a deep red band having a small full width at half maximum (FWHM), it may have high color gamut (for example, CIE 1931 reference DCI>90% or greater) and may have high luminance. However, since a precipitation process is used, it may be difficult to control a particle size. An embodiment provides a method of manufacturing a fluoride phosphor, a particle size of which can be controlled, and a scheme of improving quantum efficiency and enhancing luminance through the method.

FIG. 1 is a flow chart illustrating a method of manufacturing a fluoride phosphor according to an embodiment.

Referring to FIG. 1, a first source material containing M may be introduced to a hydrofluoric (HF) solution in operation S11.

The first source material may be at least one among $H_xMF_y$, $A_xMF_y$, and $MO_2$. For example, the first source material may be $H_2SiF_6$ or $K_2SiF_6$. After the first source material is introduced into the HF solution, the solution with the first source material present therein may be stirred for a few minutes such that the first source material may be easily dissolved. For example, in the case of $H_2SiF_6$, it may be dissolved to $2H^+$ and $SiF_6^{2-}$ during this process. Although stirring has been used as an example here and will be used as an example below, other techniques to dissolve a material may be used.

Next, in operation S12, a fluoride containing $Mn^{4+}$ may be introduced to the HF solution.

The $Mn^{4+}$-containing fluoride may be $K_2MnF_6$. Similar to the previous process, the fluoride containing $Mn^{4+}$ may be introduced to the HF solution with the first source material dissolved therein, which may, then, be stirred such that the fluoride containing $Mn^{4+}$ may be sufficiently dissolved. For example, in the case of $K_2MnF_6$, it may be dissolved to $2K^+$ and $MnF_6^{2-}$.

In this embodiment, it is illustrated that the first source material containing M and the fluoride containing $Mn^{4+}$ are sequentially introduced to the HF solution, but alternatively, an HF solution in which the first source material and the $Mn^{4+}$-containing fluoride are mixed in a different introduction order may be prepared. For example, after the $Mn^{4+}$-containing fluoride is introduced to the HF solution, the first source material containing M may be introduced thereto.

Next, in operation S14, a second source material containing A may be introduced to the HF solution, separately, multiple times, to form a fluoride phosphor expressed as $A_xMF_y$:$Mn^{4+}$ by empirical formula.

The second source material may be $AHF_2$. For example, the second source material may be $KHF_2$. The second source material may be introduced in a saturation solution state or in a powder state. For example, the source material may be a saturation solution obtained by dissolving $KHF_2$ in an HF solution. As concentrations of each source material approach the limit of solubility, a precipitate in orange may be formed. The precipitate may be $Mn^{4+}$-activated fluoride ($A_xMF_y$:$Mn^{4+}$). For example, when at least one of $H_2SiF_6$ and $K_2SiF_6$ and $KHF_2$ are used as the first and second source materials, respectively, and $K_2MnF_6$ is used as the $Mn^{4+}$-containing compound, the precipitate may be a fluoride phosphor expressed as $K_2SiF_6$:$Mn^{4+}$.

In this process, when introducing the second source material, an input amount of the second source material may be divided to control a particle size of the fluoride phosphor. Here, an average particle size and a particle size distribution may be controlled by adjusting a number of introductions, an input amount, and an introduction interval. For example, an input amount of the second source material may be divided into appropriate amounts multiple times, and an interval (a time for a reaction) of each introduction of the second source material may be set to prepare a fluoride phosphor having an intended particle size.

Also, a substantially uniform particle size distribution, which is difficult to obtain through an existing precipitation process, may be realized. For example, a particle size d (or a mass median diameter: d50) of the fluoride phosphor may range from about 5 to about 25 μm. In the particle size distribution of the fluoride phosphor, a quartile deviation (Q.D.) may have a value equal to or smaller than about 0.2. A specific example of a divided introduction method will be described with reference to FIG. 2.

Thereafter, in operation S19, the fluoride phosphor obtained in the precipitation process may be cleaned.

This cleaning process may be performed with various cleaning solutions multiple times. As the cleaning solution, an HF solution and/or an acetone solution may be used. For example, the cleaning process may include a process of removing the second source material (for example, $KHF_2$) remaining on the surface of the fluoride phosphor and a process of removing an HF component from the fluoride phosphor using acetone.

Figure 2:
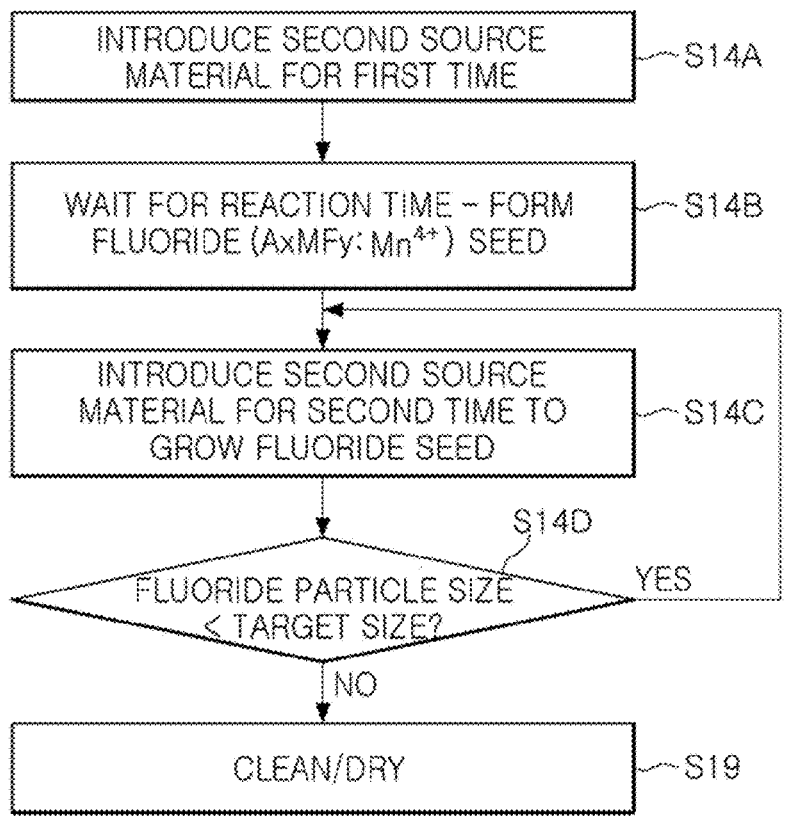
FIG. 2 is a flow chart illustrating an example of a divided introduction process that may be employed in an embodiment.

FIG. 2 is a flow chart illustrating an example of a divided introduction process that may be employed in an embodiment.

Referring to FIG. 2, an example of the divided introduction process may include a first introduction process (S14A and S14B) of forming a fluoride seed ($A_xMF_y$:$Mn^{4+}$) and a second introduction process (S14C) of growing the fluoride seed. The second introduction process may be repeated until an intended target particle size is obtained (S14D). For example, this process may be expressed by the following reaction formula.

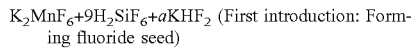
$K_2MnF_6 + 9H_2SiF_6 + aKHF_2$ (First introduction: Forming fluoride seed)

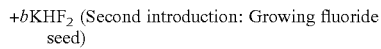
$+bKHF_2$ (Second introduction: Growing fluoride seed)

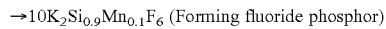
$\rightarrow 10K_2Si_{0.9}Mn_{0.1}F_6$ (Forming fluoride phosphor)

In detail, during the first introduction process (S14A), an appropriate amount (a) of a second source material for forming a fluoride seed may be provided. The fluoride seed may be in a state before precipitation takes place. The first input amount (a) may range from about 5 to about 30 wt % of the overall input amount (a+b) of the second source material. The first input amount (a) is not limited thereto and may be appropriately selected according to an intended particle size.

After the first introduction process (S14A), a reaction time for forming a fluoride seed may pass (S14B). The reaction time before the second introduction may be about 5 minutes to about 30 minutes. However, embodiments are not limited thereto and the reaction time may be varied according to the first input amount (a), reaction conditions (temperature, or the like), a desired properties of the fluoride seed, or other conditions.

During the second introduction process, an appropriate amount (b) of second source material required for growing the fluoride seed may be introduced.

The second input amount (b) may be understood as a portion of the overall input amount, excluding the first input amount (a). The second input amount (b) may be varied according to intended target particle sizes. The second input amount (b) may be introduced over multiple times until the fluoride seed is grown to have the target particle size (S14D), whereby generation of precipitation due to an instantaneous increase in concentration may be reduced or prevented. As the number of introductions is small (that is, as the single input amount increases), the particle size is reduced, the quartile deviation (QD) value of the particle size may increase (that is, having a non-uniform or large particle size distribution), and external quantum efficiency may be lowered (please refer to Experiment 1B). Thus, the second introduction process may be divided into at least three or more instances. Also, to obtain a sufficient effect of divided introduction, an interval of divided introduction may be maintained for at least three minutes or longer.

When the fluoride particle has the target particle size (S14D), the second divided introduction process may be terminated, and a desired fluoride phosphor may be obtained through a cleaning process (S19). Since the divided input amount and number may be set in advance according to intended particle size characteristics, the second source material may be introduced by the preset number, and thereafter, the process of introducing the second source material may be terminated.

Figure 3:
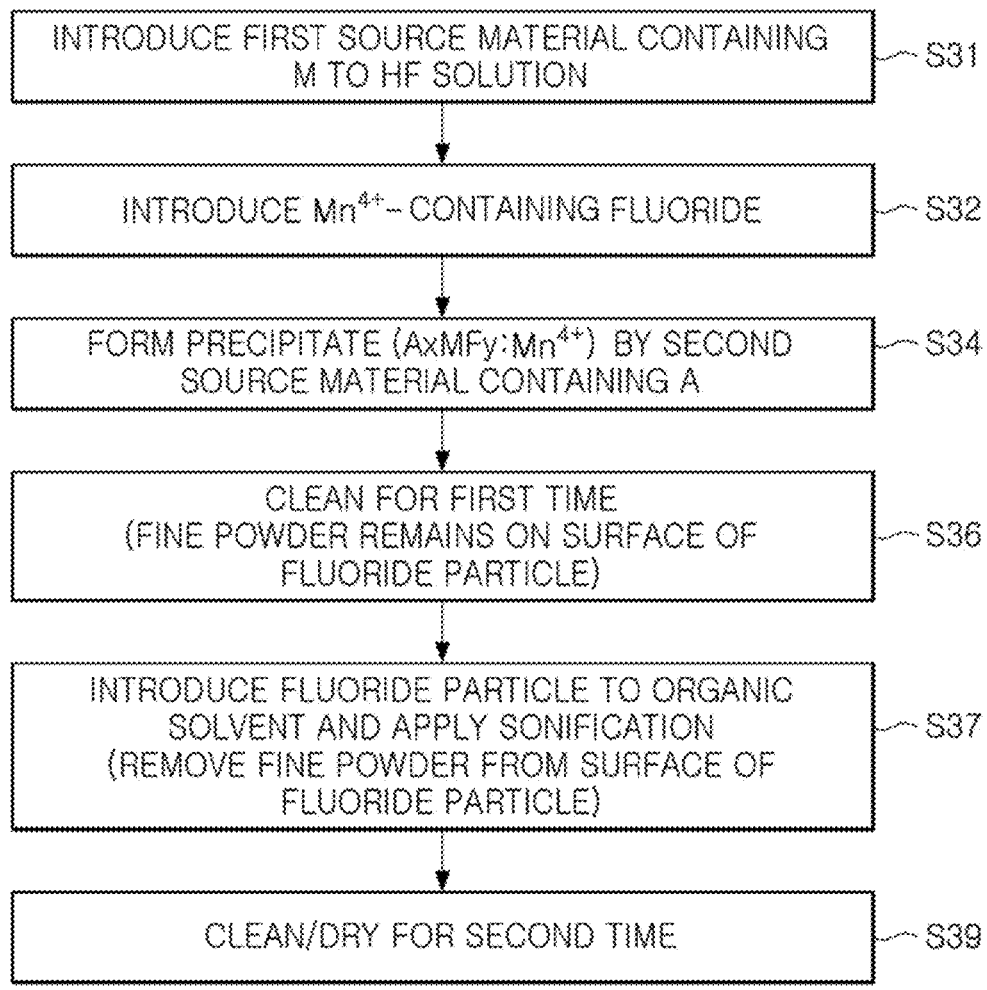
FIG. 3 is a flow chart illustrating a method of manufacturing a fluoride phosphor according to an embodiment (fine powder removal)

FIG. 3 is a flow chart illustrating a method of manufacturing a fluoride phosphor according to an embodiment (fine powder removal). Each process described in FIG. 3 may be understood with reference to the descriptions of the related process described above with reference to FIG. 1.

Referring to FIG. 3, a preparation method according to this embodiment may start from an operation (S31) of introducing a first source material containing M to an HF solution. The first source material may be at least one among $H_xMF_y$, $A_xMF_y$, and $MO_2$. For example, the first source material may be $H_2SiF_6$ or $K_2SiF_6$.

Next, in operation S32, a fluoride containing $Mn^{4+}$ may be introduced to the HF solution. The $Mn^{4+}$-containing fluoride may be $K_2MnF_6$. As described above, an HF solution in which the first source material and the $Mn^{4+}$-containing fluoride are dissolved may be prepared.

Thereafter, in operation S34, a second source material containing A may be introduced to the HF solution to precipitate fluoride particles expressed as $A_xMF_y$:$Mn^{4+}$.

The second source material may be $AHF_2$. For example, the second source material may be $KHF_2$. For example, the second source material may be in a saturation solution state or in a powder state. For example, the second source material may be a saturation solution obtained by dissolving $KHF_2$ in an HF solution, and during this process, $Mn^{4+}$-activated fluoride ($A_xMF_y$:$Mn^{4+}$) particle may precipitate.

Subsequently, in operation S36, the $Mn^{4+}$-activated fluoride particle may be cleaned. This cleaning process may be performed multiple times using various cleaning solutions. As the cleaning solutions, an HF solution and/or an acetone solution may be used.

Thereafter, in operation S37, fine powder remaining on the surface of the fluoride particles may be removed.

During this fine powder removing process, the cleaned fluoride particles may be introduced to an organic solvent and a sonification process may be applied thereto. In spite of the cleaning process (S36), fine powder of the fluoride phosphor may remain on the surfaces of the fluoride phosphor particles. Since the fine powder has a specific surface area larger than the particles themselves, having a weak moisture resistance, the fine powder may come into contact with moisture to accelerate generation of the ions (for example, $K^+$ or $F^-$). As a result, a product (a white light emitting apparatus, or the like) employing the corresponding fluoride phosphor may have degraded reliability in high temperature and high humidity environments, (for example, a change in luminance and color coordinates) and electrical characteristics such as a leakage current may be negatively affected. In order to prevent or reduce a chance of this problem, the fine powder removing process may be performed.

The organic solvent used during this fine powder removing process may be an organic solvent having a polarity equal to or greater than about 4.0. For example, the organic solvent may be at least one selected from among methanol, ethanol, n-propyl alcohol, isopropyl alcohol, n-butyl alcohol, and acetone. Although not limited thereto, sonification may be performed at tens to hundreds of Hz (for example, 40 to 50 Hz) for about a few minutes to tens of minutes. Through the ultrasonic grinding (sonification process), fine powder may be effectively removed from the surface of the phosphor.

Thereafter, in operation S39, the fine powder-removed fluoride phosphor may be cleaned for a second time. During this cleaning process, the organic solvent used in the fine powder removing process may be removed from the fluoride phosphor by using acetone as a solvent.

Figure 4:
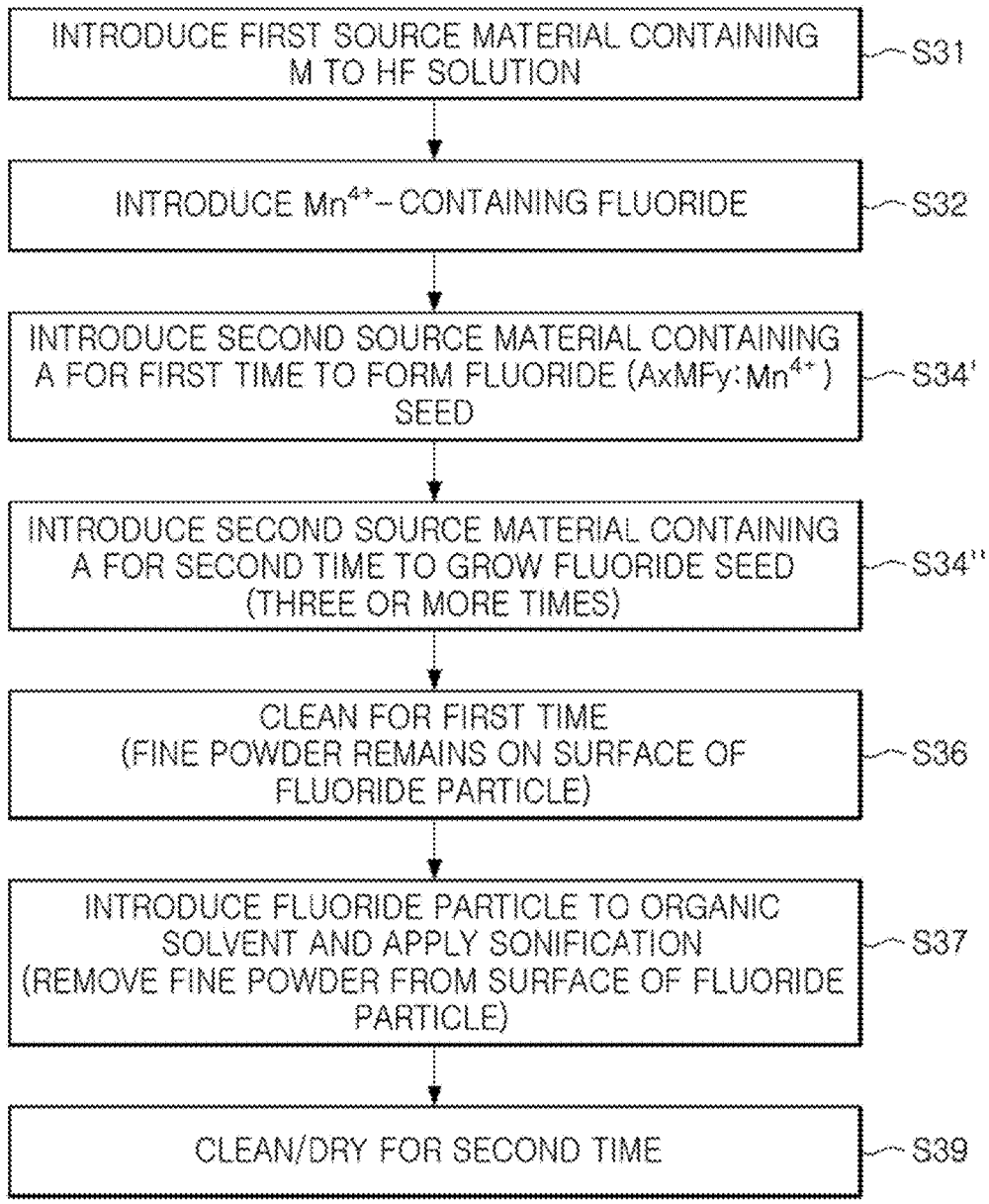
FIG. 4 is a flow chart illustrating a method of manufacturing a fluoride phosphor according to an embodiment (particle size control+fine powder removal)

The particle size control and the fine powder removal may be performed together in a single fluoride phosphor preparing process. FIG. 4 is a flow chart illustrating a method of manufacturing a fluoride phosphor according to an embodiment in which particle size control and fine powder removal are performed together.

Referring to FIG. 4, in the preparation method according to this embodiment, similarly to other embodiments, a first source material containing M is introduced to an HF solution in operation S31, and subsequently, a fluoride containing $M'^{4+}$ may be introduced to the HF solution in operation S32. Here, the order of the introduction processes may be changed or the introduction processes may be performed simultaneously.

Next, a second source material containing A may be introduced to the HF solution dividedly multiple times to precipitate the fluoride particles expressed as $A_xMF_y$:$Mn^{4+}$.

The process of introducing the second source material employed in this embodiment may include introducing the second source material for a first time to form a fluoride seed ($A_xMF_y$:$Mn^{4+}$) (S34'), and subsequently introducing the second source material for a second time to grow the fluoride seed as a fluoride phosphor having a desired particle size (S34"). The second introduction process may be divided into three or more instances so the second source material may be introduced in three or more instances, and the process of introducing the second source material may be combined with reference to the matters illustrated in FIG. 2 above.

In this manner, by adjusting the number of introductions, the input amount, and the interval in the process of dividedly introducing the second source material, a particle size of the precipitated phosphor may be controlled and an overall particle size distribution may also be more uniformly formed.

Subsequently, in operation S36, the $Mn^{4+}$-activated fluoride particle may be cleaned. This cleaning process may be performed with different cleaning solutions multiple times. As the cleaning solution, an HF solution and/or an acetone solution may be used.

Thereafter, in operation S37, fine powder remaining on the surfaces of the fluoride particles may be removed.

The fine powder removing process may be performed by introducing the cleaned fluoride particles to an organic solvent and performing sonification thereon. Through the fine powder removing process, a degradation of reliability and electrical characteristics due to fine powder may be improved.

Subsequently, in operation S39, the fine powder-removed fluoride phosphor may be cleaned for a second time. During this cleaning process, the organic solvent used in the fine powder removing process may be removed from the fluoride phosphor using the acetone solvent.

The fluoride phosphor according to some embodiments may improve a variability of optical characteristics, while having improved wavelength conversion characteristics as a red phosphor and higher reliability in a higher temperature and higher humidity environment. Thus, the fluoride phosphor may be advantageously used in various applications.

Figure 5:
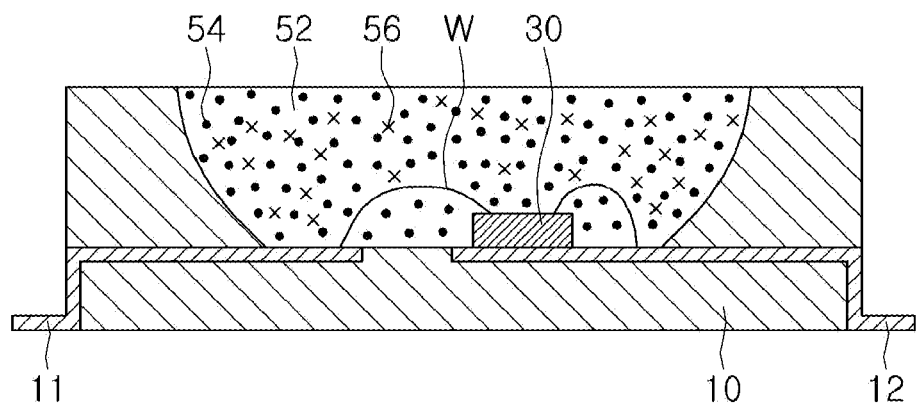
FIGS. 5 and 6 are cross-sectional views illustrating a white light emitting apparatus according to various embodiments.
Figure 6:
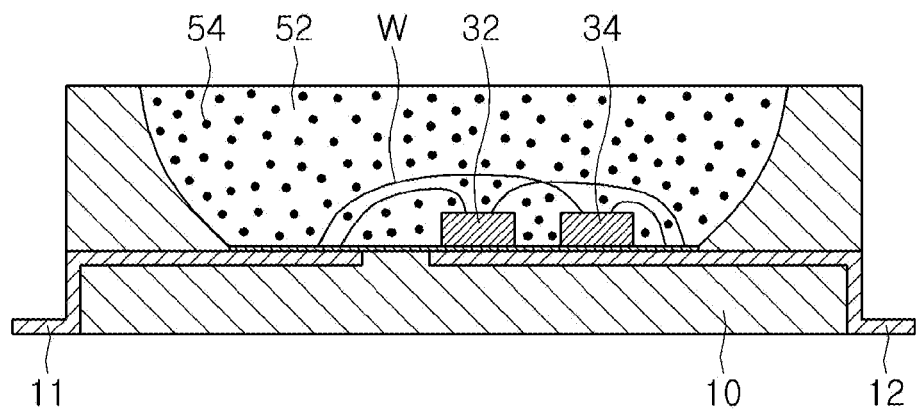

FIGS. 5 and 6 illustrate a white light emitting apparatus employing the fluoride phosphor according to various embodiments.

A white light emitting apparatus 100A illustrated in FIG. 5 may include a package body 10 having a cavity, a semiconductor light emitting device 30 disposed in the cavity, and a resin packing unit 52 disposed in the cavity. The resin packing unit 152 may be formed of a light-transmissive resin. For example, the resin packing unit 52 may be formed of an epoxy, silicone, strained silicone, a urethane resin, an oxetane resin, an acryl, a polycarbonate, a polyimide, similar materials, and combinations thereof.

Also, the white light emitting apparatus 100A may include a pair of lead frames 11 and 12 electrically connected to the semiconductor light emitting device 30 and conductive wires W connecting the semiconductor light emitting device 30 and the lead frames 11 and 12.

The package body 10 may include an opaque resin or an insulating material having a relatively high reflectivity. For example, the package body 10 may be formed of a polymer resin that can be more easily injection-molded or ceramics that can more easily dissipate heat. The pair of lead frames 11 and 12 are disposed in the package body 10 and may be electrically connected to the semiconductor light emitting device 30 in order to apply driving power to the semiconductor light emitting device 30.

In the resin packing unit 52, a red phosphor 54 and a green phosphor 56 may be dispersed. The red phosphor 54 may include the fluoride phosphor formed according to an embodiment described herein. A dominant wavelength of the blue semiconductor light emitting device 30 may range from about 420 nm to about 470 nm. The red phosphor 54 in this embodiment may have a wavelength peak ranging from about 620 nm to about 640 nm. An emission wavelength peak of the green phosphor 56 may range from about 500 nm to about 550 nm. The blue semiconductor light emitting device 30 may have a full width at half maximum (FWHM) ranging from about 10 nm to about 50 nm, the red phosphor 54 may have an FWHM ranging from about 50 nm to about 180 nm, and the green phosphor 56 may have an FWHM ranging from about 30 nm to about 200 nm.

The green phosphor 56 that may be used for realizing white light and any other additional phosphor (e.g., a yellow or orange-yellow phosphor) will be described with reference to FIG. 6.

The use of two types of phosphors excited by blue light, together with the blue semiconductor light emitting device 30, as light sources, in the white light emitting apparatus illustrated in FIG. 5, is illustrated, but one type thereof may be replaced with a semiconductor light emitting device as illustrated in FIG. 6.

Similarly to other embodiments, a white light emitting apparatus 100B illustrated in FIG. 6 may include a package body 10, lead frames 11 and 12, and a resin packing unit 52. However, unlike the embodiment of FIG. 5, two semiconductor light emitting devices 32 and 34 may be disposed in a cavity.

The first and second semiconductor light emitting devices 32 and 34 may be configured to emit light having different wavelengths. For example, the first semiconductor light emitting device 32 may be configured to emit blue light, and the second semiconductor light 34 emitting device may be configured to emit green light. In this embodiment, the resin packing unit 52 may include the fluoride phosphor 54, as a red phosphor, obtained as described above in an embodiment.

The semiconductor light emitting devices 30, 32, and 34 illustrated in FIGS. 5 and 6 may be light emitting devices illustrated in FIGS. 17A to 19.

Hereinafter, operations and effects of manufacturing methods according to various embodiments will be described in more detail.

Experiment 1A: Effect of Controlling Particle Size According to Divided Introduction Multiple Times Embodiment 1A In this embodiment, 200 mmol of $H_2SiF_6$ (34%) was introduced to 720 ml of HF solution and stirred for five minutes so as to be dissolved, and thereafter, 22 mmol of $K_2MnF_6$ was introduced and stirred so as to be similarly ionized. A HF solution in which the two source materials are dissolved was prepared. A saturated $KHF_2$ solution (prepared by dissolving $KHF_2$ in another HF solution) was introduced to the HF solution multiple times.

The divided introduction condition of the saturated $KHF_2$ solution was set to 8:46 with respect to a mole ratio of a first input amount and a second input amount, and after the saturated $KHF_2$ solution was first introduced, substantially the same amount of saturated $KHF_2$ solution was introduced three times, separately, 10 minutes later. Here, an interval of an instance of the second introduction was managed to be a minimum of 3 minutes.

As a result, an orange $K_2SiF_6:Mn^{4+}$ phosphor was precipitated. Subsequently, the fluoride phosphor, a precipitate, was sequentially cleaned with 49% of HF solution and acetone to obtain a $K_2SiF_6:Mn^{4+}$ phosphor in a cubic phase. An average particle size (d50) of the phosphor was about 20.5 μm.

Comparative Example 1A

In the Comparative Example 1A, a fluoride phosphor was prepared according to according to a liquid phase synthesis method under the same conditions as those of Embodiment 1A, and a saturated $KHF_2$ solution was continuously introduced once to the HF solution with the two source materials dissolved therein to induce precipitation. A $K_2SiF_6:Mn^{4+}$ phosphor having a particle size (about 20.3 μm) similar to that of the phosphor obtained in Embodiment 1A was obtained by adjusting an input amount of the saturated solution.

Quartile deviation (Q.D.), external quantum efficiency (EQE), and internal quantum efficiency (IQE) obtained in Embodiment 1A and Comparative Example 1A, were measured. The measurement results are illustrated in Table 1.

TABLE 1

| Classification | d50 particle size (μm) | Q.D. | EQE | IQE |
|---|---|---|---|---|
| Embodiment 1A | 20.5 | 0.180 | 61.0% | 86.3% |
| Comparative Example 1A | 20.3 | 0.278 | 60.3% | 84.6% |

As illustrated in Table 1, under similar particle size conditions, a quartile deviation value of Embodiment 1A is 0.180, while that of Comparative Example 1A is 0.278. Thus, it can be seen that particles of the phosphor having a more uniform particle size were effectively distributed through the divided introduction. Also, it can be seen that the EQE and the IQE of Embodiment 1A were better than those of Comparative Example 1A.

Experiment 1B: Effect of Dividing Second Introduction

In this experiment, a $K_2SiF_6:Mn^{4+}$ phosphor was prepared under the same conditions as those of Embodiment 1A, except that two samples (samples A and B) were additionally prepared by differing a number of second introductions and an input amount for each second introduction. In detail, in sample A, the second introduction was performed once. That is, the second input amount, the same as that of Embodiment 1A, was introduced once. In sample B, the second input amount, the same as that of Embodiment 1A, was divided to be equal and introduced two times.

A particle size, Q.D., and EQE of the phosphors according to Samples A and B were measured. The measurement results are illustrated in Table 2.

TABLE 2

| Classification | d50 particle size (μm) | Q.D. | EQE |
|---|---|---|---|
| Sample A | 9.4 | 0.288 | 46.9% |
| Sample B | 11.7 | 0.231 | 56.2% |
| Embodiment 1A | 20.5 | 0.180 | 61.0% |

It can be seen that, under the same second input amount conditions, as the second introduction division amount increased, average particle sizes increased and Q.D. values decreased. In this manner, it can be understood that, when the second introduction for growth is divided into two or fewer times, precipitate occurs due to an instantaneous increase in concentration, and thus, the particle size decreased and the Q.D. value increased (non-uniform particular size distribution). Also, in a case in which when the introductions amount is three or greater times (Embodiment 1A), EQE and IQE were improved to be higher than those of Sample A and Sample B.

Experiment 1C: Change According to Ratio of First/Second Input Amount

In this experiment, four samples (Sample 1 to 3, and 5) of $K_2SiF_6:Mn^{4+}$ phosphors were prepared under the same conditions as those of Embodiment 1A, except for a ratio of a first input amount and a second input amount. That is, the overall input amounts of the samples were equal and ratios of the first input amount (a) to the overall input amount (a+b) were different as illustrated in Table 3. Here, Sample 4 corresponds to Embodiment 1A. Average particle sizes and Q.D. values of Samples 1 to 3 and Sample 5 were measured as illustrated in Table 3.

TABLE 3

| Classification | First input amount (a) | Second input amount (b) | Ratio of first input amount (wt %) | d50 (μm) | Q.D. | EQE |
|---|---|---|---|---|---|---|
| Sample 1 | 20 | 34 | 37.0 | 12.6 | 0.191 | 54.4% |
| Sample 2 | 16 | 38 | 29.6 | 15.1 | 0.187 | 55.7% |
| Sample 3 | 12 | 42 | 22.2 | 17.3 | 0.195 | 58.1% |
| Sample 4 | 8 | 46 | 14.8 | 20.5 | 0.180 | 61.0% |
| Sample 5 | 4 | 50 | 7.4 | 22.8 | 0.198 | 62.3% |

As illustrated in Table 3, it can be seen that, under the same input amount conditions, the average particle sizes were decreased as the proportion of the first input amount was increased. In this manner, it may be confirmed that a desired particle size may be obtained by adjusting the proportion of the first input amount. Also, Q.D. values of the samples were similar, ranging from 0.180 to 0.198, which were relatively low (indicating a relatively high uniformity)

at below 0.2. In this manner, it may be confirmed that uniformity of particle size distribution is affected by the number of instances in the second introduction, more than by the proportion of the first input amount.

Meanwhile, regarding EQE, EQE of Sample 1 was 54.4%, slightly low, while it may be confirmed that EQE was improved as the proportion of the first input amount is decreased. That is, the proportion of the first input amount slightly affects efficiency of phosphor. Based on the results of this experiment, although not limited thereto, a proportion of the first input amount against the overall input amount may be set to range from about 5 to 30 wt % in consideration of the phosphor efficiency and the particle size condition (e.g., 5 to 25 μm).

Experiment 1D: Application of White Light Emitting Apparatus

Figure 7:
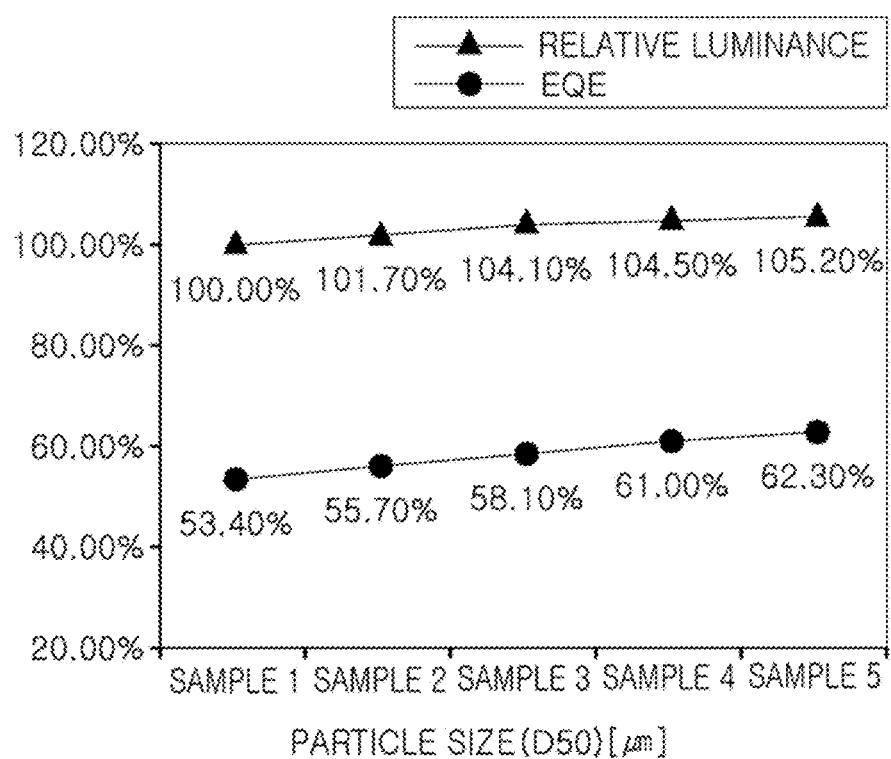
FIG. 7 is a graph illustrating relative luminance and external quantum efficiency (EQE) of samples according to Embodiment 1C.

In this experiment, a white light emitting apparatus having a relatively high color gamut and relatively high luminance characteristics was configured as follows. A blue LED chip having a dominant wavelength of about 446 nm was used as a light source, and a β-SIALON phosphor having a peak wavelength of about 533 nm was used as a green phosphor. Also, as red phosphors, Sample 1 to Sample 5 obtained from Experiment 1C were used. The green phosphor and the red phosphors were mixed according to the ratios described in Table 4 such that the substantially same color coordinates are presented, and relative luminance of light emitted from the white light emitting apparatuses manufactured thusly was measured. The measurement results are illustrated in FIG. 7 together with Table 4. In FIG. 7, EQE of phosphors of the samples are also shown.

TABLE 4

| Classification | Green phosphor (wt %) | Red phosphor (wt %) | Relative luminance (%) |
|---|---|---|---|
| sample 1 | 32.5 | 67.5 | 100 |
| Sample 2 | 32.0 | 68.0 | 101.7 |
| Sample 3 | 34.0 | 66.0 | 104.1 |
| Sample 4 (Embodiment 1A) | 33.0 | 67.0 | 104.5 |
| Sample 5 | 34.5 | 65.5 | 105.2 |

As illustrated in Table 4 and FIG. 7, it can be seen that, in the same target mixture ratio, relative luminance of white light emitting apparatuses were increased as the particle size (d50) of the fluoride phosphor was increased. This is understood that, as the particle size of the fluoride phosphor is increased, EQE is increased together, and thus, an amount of phosphor used in the white light emitting apparatuses is reduced and light loss is minimized. However, the particle size of the phosphor may be limited by other process factors. For example, when the white light emitting apparatus is mass-produced, if the particle size of the phosphor is increased excessively (for example, 25 μm or greater), a needle used during a dispensing process may be clogged. Thus, a particle size of a phosphor may be set to be within an appropriate range in consideration of other process factors as well as efficiency. For example, $K_2SiF_6:Mn^{4+}$ phosphor may be adjusted to have a particle size ranging from about 5 μm to about 25 μm. According to such a particle size condition, an overall distribution of a particle size may be more precisely and uniformly adjusted through the particle size control method (divided introduction) according to an embodiment described herein.

Experiment 2A: Effect of Removing Fine Powder

Embodiment 2A

In this embodiment, synthesis of a $K_2SiF_6:Mn^{4+}$ phosphor was divided into synthesis of $K_2MnF_6$ and synthesis of $K_2SiF_6:Mn^{4+}$, and the synthesis of $K_2MnF_6$ and the synthesis of $K_2SiF_6:Mn^{4+}$ were performed. First, 0.5 mol of $KHF_2$ powder (a relatively small amount of $KHF_2$ powder) and 0.05 mol of $KMnO_4$ powder were introduced to a 49% HF solution and stirred so as to be dissolved. Subsequently, 30% $H_2O_2$ 6 ml was slowly dropped to synthesize an orange precipitate. After the synthesis reaction was finished, a supernatant was discarded and 70 ml of 49% HF aqueous solution was put and stirred for five minutes to remove residual $KHF_2$. To remove fine powder, the synthesized $K_2SiF_6:Mn^{4+}$ phosphor was introduced to an ethanol solution and sonification was applied thereto. The sonification process was performed for about 10 minutes using a frequency ranging from 40 Hz to 50 Hz.

Comparative Example 2A

In Comparative Example 2A, a $K_2SiF_6:Mn^{4+}$ phosphor was prepared under the same conditions as those of Embodiment 2A through a liquid phase synthesis method, but a fine powder removing process such as in Embodiment 2A was not performed.

Figure 8A:
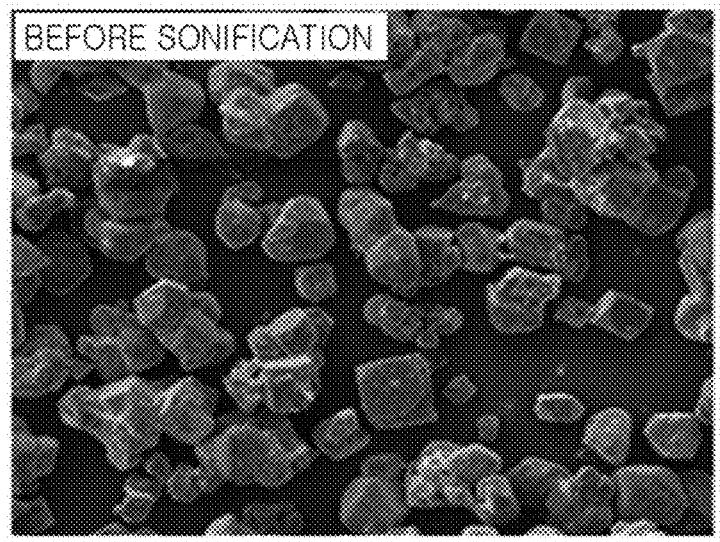
FIGS. 8A and 8B are scanning electron microscope (SEM) photographs of fluoride phosphors according to Embodiment 2A and Comparative Example 2A.
Figure 8B:
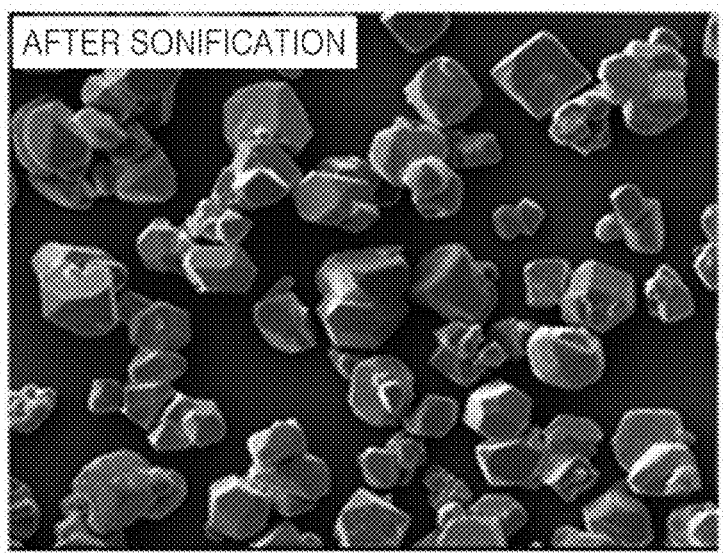

Phosphors obtained according to Comparative Example 2A and Embodiment 2A were imaged by an SEM as illustrated in FIGS. 8A and 8B, respectively.

In the case of the phosphor according to Comparative Example 2A before fine power was removed as illustrated in FIG. 8A, a large amount of fine powder remain on surfaces of the phosphor in spite of a cleaning process, while in the case of the phosphor according to Embodiment 2A after the removing of fine powder using sonification as illustrated in FIG. 8B, particles of the phosphor had a relatively clean surface and a relatively clear cubic shape. Thus, it was confirmed that fine powder, which are not likely to be removed through a general cleaning process, was removed and/or removed to a greater degree through the sonification process.

Experiment 2B:

Application of White Light Emitting Apparatus—Evaluation of Reliability

In this experiment, white light emitting apparatuses were configured as follows. A blue LED chip having a dominant wavelength of about 446 nm was used as a light source, and a β-SIALON phosphor having a peak wavelength of about 553 nm was used as a green phosphor. Also, as red phosphors, phosphors obtained according to Embodiment 2A and Comparative Example 2A were used. The green phosphor and the red phosphors were mixed in an appropriate ratio to present the substantially same color coordinates and mixed with a silicon resin. The phosphor-mixed resin was applied to the blue LED chip using a dispenser, and cured at 170° C. for one and a half hour to manufacture white light emitting apparatuses (Embodiment 2B and Comparative Example 2B). Electrical characteristics (I-V characteristics) and a change in appearance characteristics and a change in long-term reliability characteristics thereof were measured.

Figure 9:
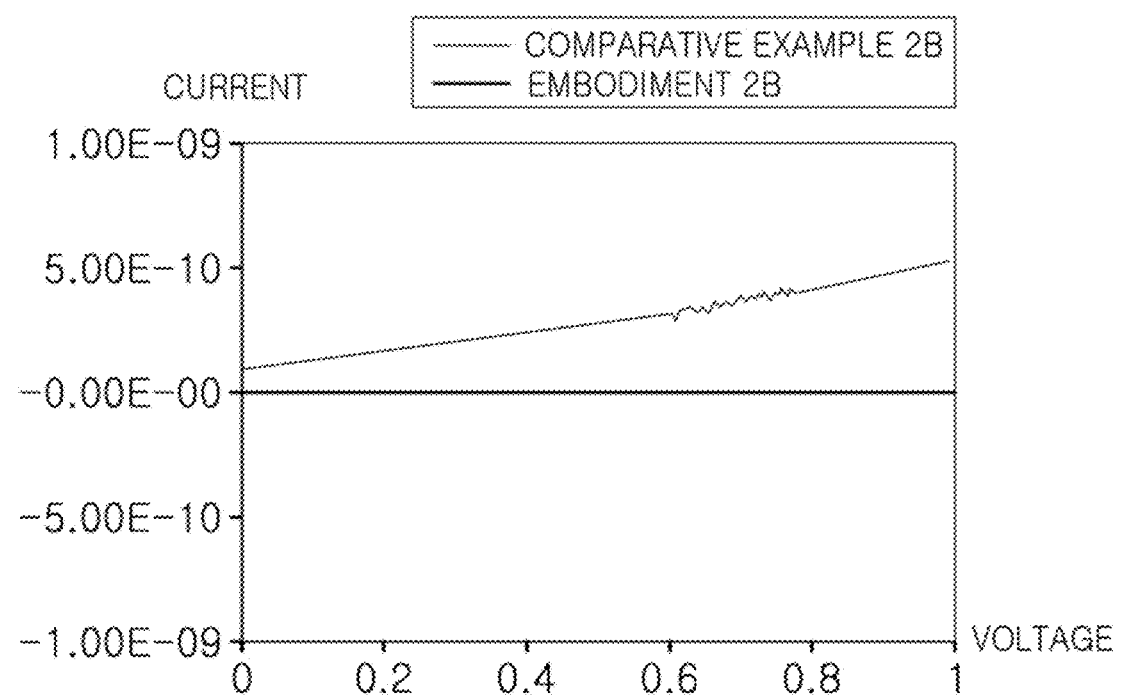
FIG. 9 is a graph illustrating IV test results of semiconductor light emitting apparatuses according to Embodiment 2B and Comparative Example 2B.

First, I-V characteristics of the white light emitting apparatuses according to Embodiment 2B and Comparative Example 2B were measured, and the results are illustrated in FIG. 9. As illustrated in FIG. 9, it was confirmed that, in the white light emitting apparatus (Comparative Example 2B) employing the phosphor before removing fine powder, a current flows at a low voltage, while in the white light emitting apparatus (Embodiment 2B) employing the phosphor after removing fine powder, a current does not flow. This may be understood as an effect that fine power causing a leakage current was removed.

Figure 10A:
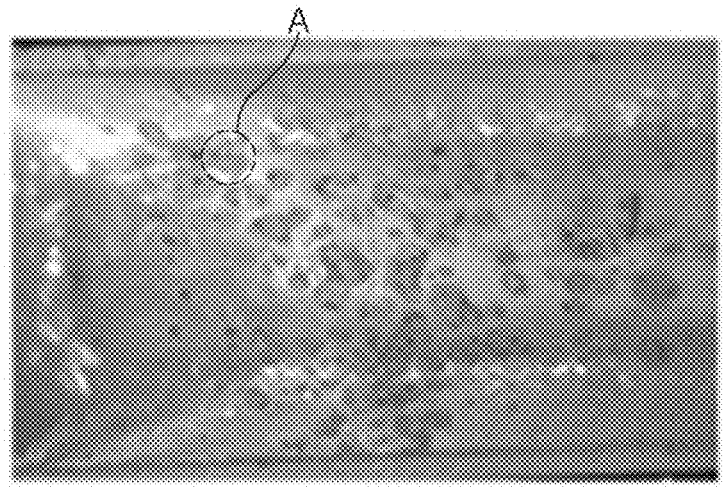
FIGS. 10A and 10B are optical microscope photographs of the semiconductor light emitting apparatuses according to Embodiment 2B and Comparative Example 2B.
Figure 10B:
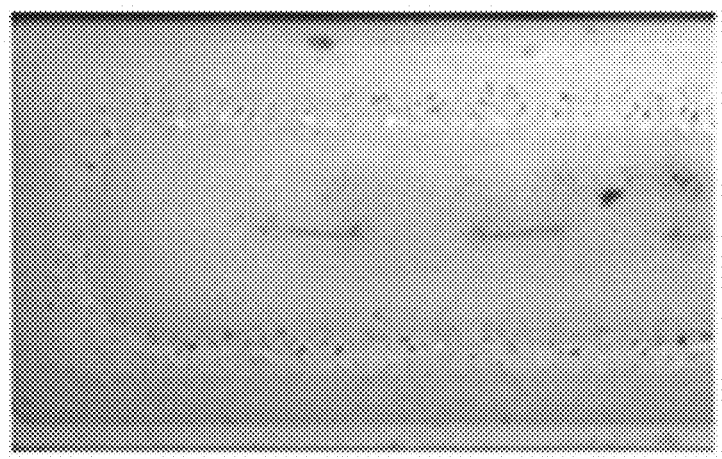

In addition, after the white light emitting apparatuses according to Embodiment 2B and Comparative Example 2B were preserved under a relatively high temperature and relatively high humidity conditions (85° C. and 85%) for a predetermined period of time, a change in the appearance and a change in characteristics of an emission spectrum thereof were observed. FIGS. 10A and 10B are optical images obtained by imaging resin packing units of the white light emitting apparatuses according to Comparative Example 2B and Embodiment 2B, respectively. The measurement conditions were results obtained after preservation for 500 hours under the relatively high temperature and relatively high humidity conditions (85° C. and 85%).

In the case of Comparative Example 2B illustrated in FIG. 10A, it can be seen that a portion (A) was deformed in reaction with silicon (Si) on a surface of the resin packing unit. In contrast, in the case of Embodiment 2B illustrated in FIG. 10B, a deformed portion was not observed on the surface of the resin packing unit.

A precise qualitative analysis was performed on the deformed portion in the semiconductor light emitting apparatus. The qualitative analysis was performed on the deformed portion through energy dispersive x-ray spectroscopy (EDS). As a result, when the deformed portion (A) and other non-deformed portion were compared and analyzed based on EDS data, it was observed that $K^+$ and $F^-$ ions, material components of a phosphor, were detected. Based on the detection results, it may be predicted that $K^+$ and $F^-$ ions, material components of a phosphor, are dissolved in high humidity and react to silicon (Si) to cause the surface to be deformed. Thus, as in Embodiment 2B, by more completely removing fine powder, an undesired reaction may be suppressed and deformation that may occur in the resin packing unit may be reduced or effectively prevented.

Figure 11A:
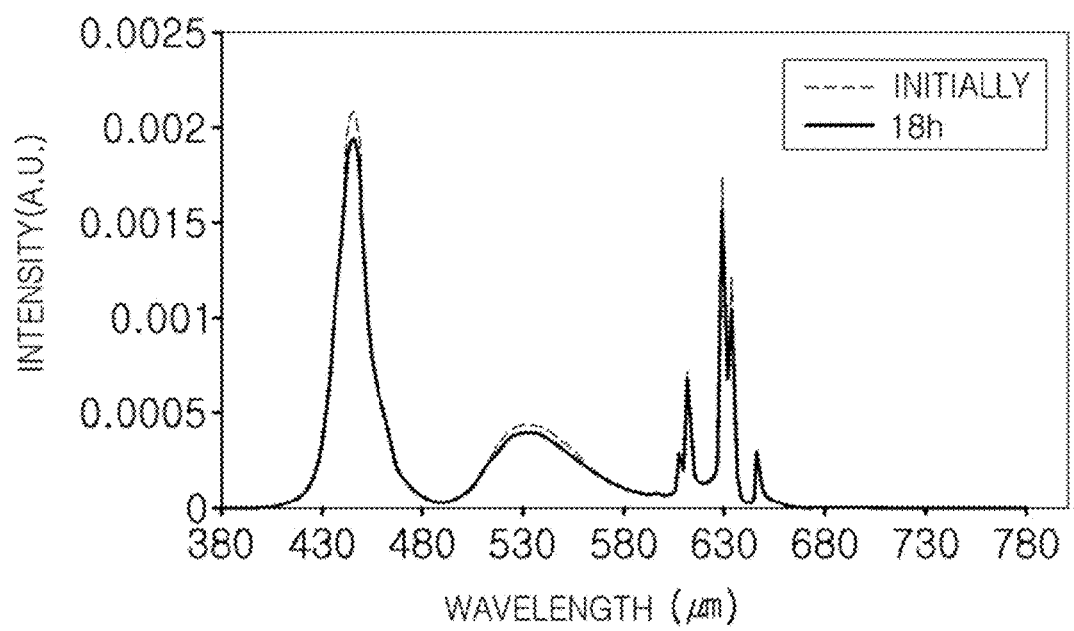
FIGS. 11A and 11B are graphs illustrating emission spectrums of the semiconductor light emitting apparatuses according to Embodiment 2B and Comparative Example 2B.
Figure 11B:
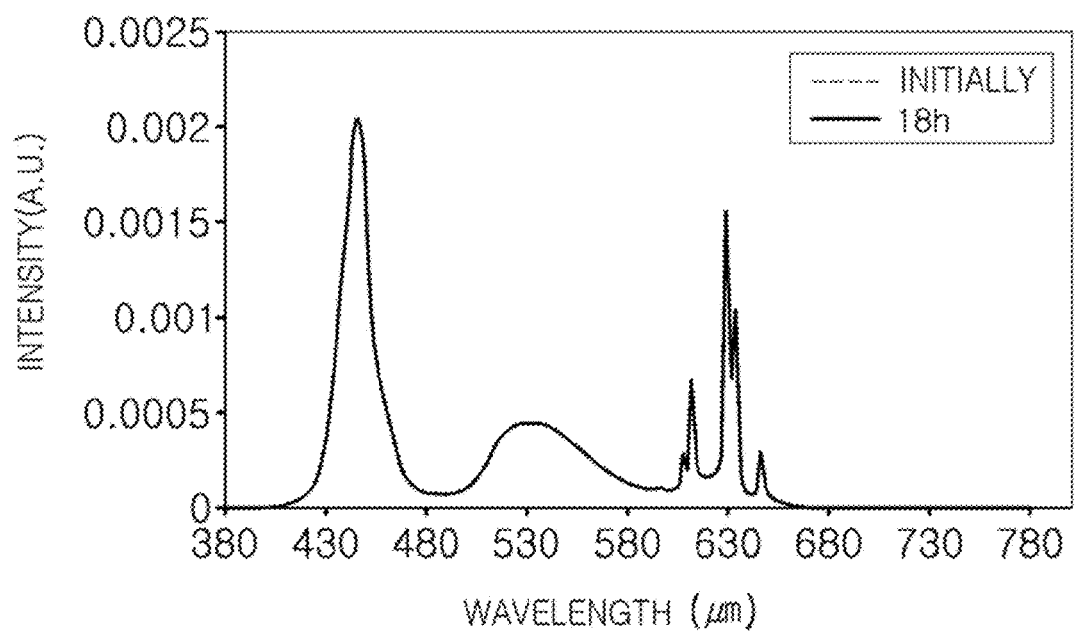

Also, after the white light emitting apparatuses according to Comparative Example 2B and Embodiment 2B were preserved under high temperature and high humidity (85° C., 85%) conditions for 15 hours, changes in emission spectrums were measured. FIGS. 11A and 11B illustrate changes in emission spectrums according to Comparative Example 2B and Embodiment 2B.

As illustrated in FIG. 11A, in Comparative Example 2B, the emission spectrum was slightly changed. In contrast, however, as illustrated in FIG. 11B, in Embodiment 2B, the emission spectrum was changed to a lesser degree even after the white light emitting apparatus was left for 15 hours. Such a change in the emission spectrum was made due to deformation ("A" of FIG. 10A) due to fine powder, and it can be seen that such a change can be distinctively improved in Embodiment 2B in which fine powder was removed.

The embodiments described above may be combined with various coating processes (fluoride coating and/or organic coating) so as to be variously modified.

Figure 12:
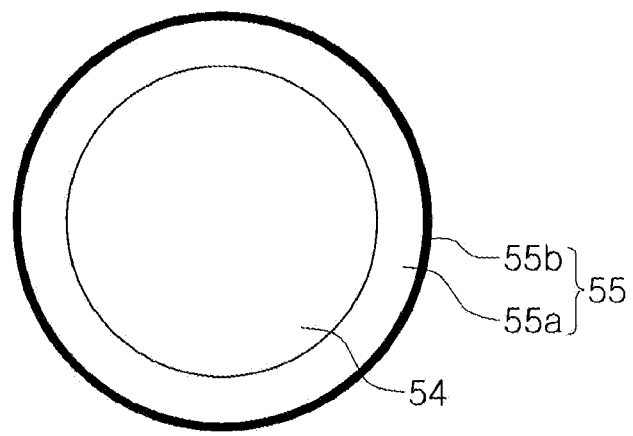
FIG. 12 is a cross-sectional view schematically illustrating a particle of a fluoride phosphor according to an embodiment.

FIG. 12 is a schematic view illustrating a cross-section of a particle of a fluoride phosphor that can be obtained through a manufacturing method according to an embodiment.

A fluoride phosphor particle illustrated in FIG. 12 includes a fluoride particle (which is also called a "core") 54 expressed as $A_xMF_y:Mn^{4+}$ and a shell structure 55 encapsulating the fluoride core 54. The shell structure 55 includes a fluoride coating (or a first shell) 55a not containing manganese (Mn) and an organic coating (or a second shell) 55b formed on a surface of the fluoride coating.

The fluoride particle 54 corresponding to a core may include a fluoride expressed as $A_xMF_y:Mn^{4+}$. In this embodiment, a structure protecting the fluoride particle 54 may be provided as a dual-shell structure 55 having the fluoride coating 55a and the organic coating 55b.

The fluoride coating 55a corresponding to the first shell may be directly disposed on the surface of the fluoride core 54. The fluoride coating 55a may include a fluoride expressed as $A_xMF_y$ by empirical formula. For example, the fluoride coating 55a may include $K_2TiF_6$, $K_2SnF_6$, $Na_2TiF_6$, $Na_2ZrF_6$, $K_3SiF_7$, $K_3ZrF_7^+$, or $K_3SiF_5$. For example, in a case in which the fluoride core 54 is $K_2SiF_6:Mn^{4+}$, the fluoride coating 55a may be $K_2SiF_6$.

The organic coating 55b corresponding to the second shell may be formed of a hydrophobic organic material physically adsorbed on a surface of the fluoride coating 55a. The organic coating 55b may be formed of an organic compound having light transmittance and formed as a relatively thin film (for example, 0.1 µm or less) having a relatively reduced thickness (e.g., less than or equal to 0.1 µm). The organic coating 55b may include an organic compound having at least one functional group among a carboxyl group (—COOH) and an amine group (—NH$_2$) and having 4 to 18 carbon atoms. For example, the organic coating 55B may be acrylate having at least one functional group among the carboxyl group (—COOH) and the amine group (—NH$_2$).

Figure 13:
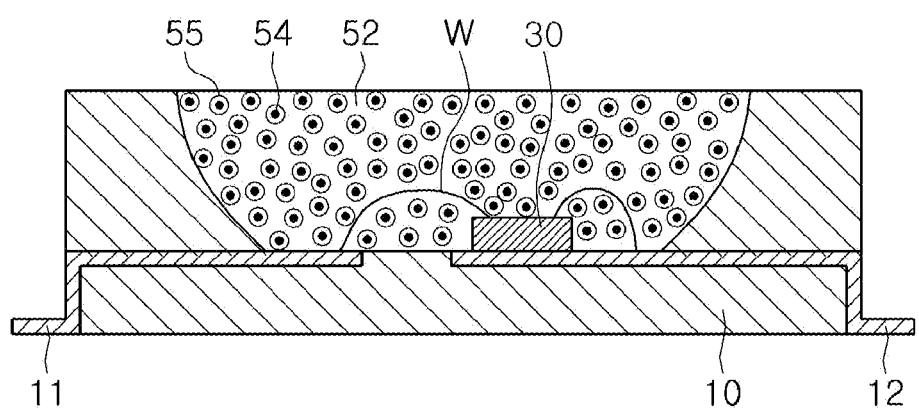
FIG. 13 is a cross-sectional view illustrating a white light emitting apparatus according to an embodiment.

Since the dual-shell structure having the organic coating 55b together with the fluoride coating 55a is employed, an effect of improving reliability of the $Mn^{4+}$-activated fluoride particle 54 may be maximized. FIG. 13 illustrates a semiconductor light emitting apparatus 100C in which fluoride phosphors 54 having the dual-shell structure 55 are dispersed in a resin packing unit. Since the semiconductor light emitting apparatus 100C illustrated in FIG. 13 employs the fluoride phosphor 54 having the dual-shell structure 55, moisture may be effectively blocked, maintaining higher reliability in a relatively high temperature, high humidity environment.

Figure 14:
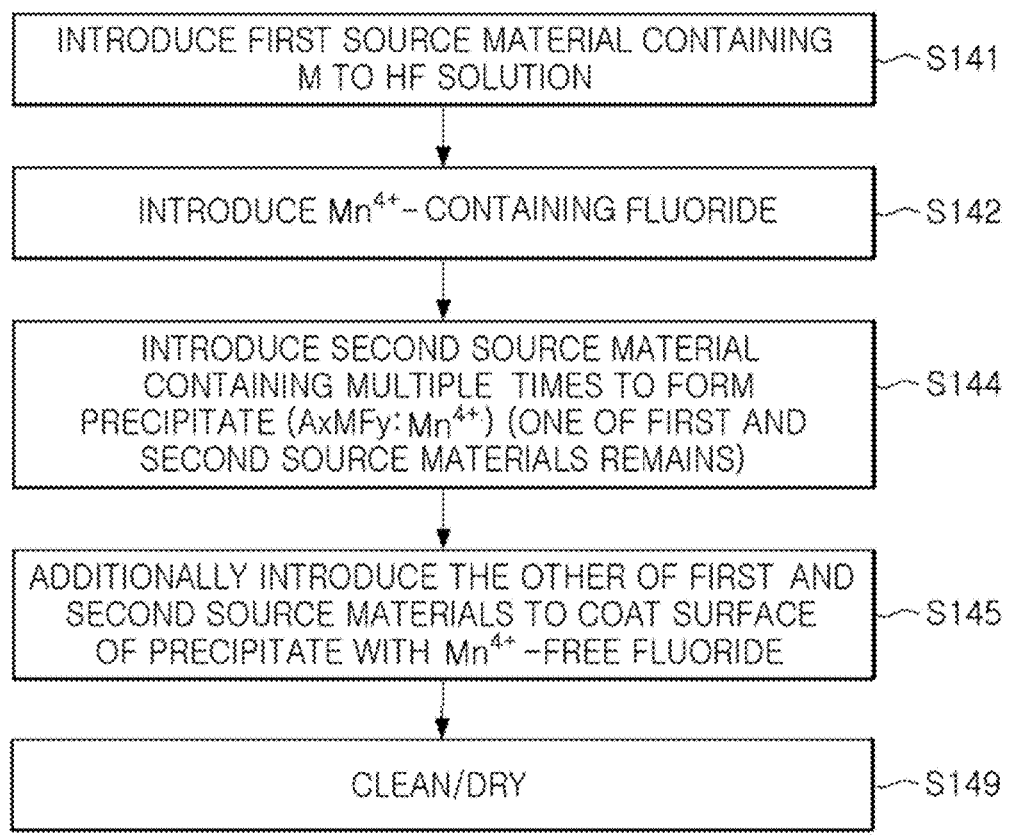
FIG. 14 is a flow chart illustrating a method of manufacturing a fluoride phosphor according to an embodiment (particle size control+fluoride coating)

Such a coating process may be variously performed in combination with a particle size control process (divided introduction process) and/or fine powder removing process. FIG. 14 is a flow chart illustrating a fluoride phosphor, in which a fluoride coating process and a particle size control process are combined.

Referring to FIG. 14, a process (S141) of introducing a first source material containing M to an HF solution may start. The first source material may be at least one among $H_xMF_y$, $A_xMF_y$, and $MO_2$. For example, the first source material may be $H_2SiF_6$ or $K_2SiF_6$.

Next, in operation S142, a fluoride containing $Mn^{4+}$ may be introduced to the HF solution. The $Mn^{4+}$-containing fluoride may be $K_2MnF_6$.

Thereafter, in operation S144, a second source material containing A may be introduced to the HF solution to make fluoride particles expressed as $A_xMF_y:Mn^{4+}$ by empirical formula precipitate. The second source material may be $AHF_2$. For example, the second source material may be $KHF_2$. As described above with reference to FIGS. 1 and 2, particle size and particle size distribution may be controlled by adjusting the introduction division amount and intervals. In this manner, during this divided introduction process, a size of phosphor particles to be coated and a distribution thereof may be determined.

In this embodiment, even after the synthesizing process is completed, the second source material containing A may remain. Meanwhile, the manganese ion ($Mn^{4+}$) within the HF solution may be almost exhausted during the synthesizing process. In order to allow the second source material to remain, the second source material may be excessively introduced. An excessive amount (or a residual amount) of the second source material may be set in consideration of an input amount of other synthesized source materials and solubility of the HF solution.

Thereafter, in operation S145, the first source material may be additionally applied to the HF solution in which the fluoride particles have been formed, to coat the fluoride particles with the fluoride not containing manganese.

In the previous synthesizing process, since the second source material remains, while the manganese ion $Mn^{4+}$ is almost exhausted, a fluoride containing A and M without manganese may be formed by the additionally introduced first source material. The fluoride without manganese (or the manganese (Mn)-free fluoride) may coat the fluoride particles formed as precipitate in the previous process. Through the coating process, the fluoride phosphor coated with the Mn-free fluoride may be obtained.

For example, in the previous process, in a case in which $K_2SiF_6$:$Mn^{4+}$ has been synthesized, when a predetermined amount of $H_2SiF_6$ solution is additionally supplied to the HF solution, the $H_2SiF_6$ solution reacts with the residual $KHF_2$ to produce $K_2SiF_6$ and, here, $K_2SiF_6$ without containing a manganese ion ($Mn^{4+}$) may be coated on a surface of the $K_2SiF_6$:$Mn^{4+}$ phosphor core.

During this coating process, a thickness of the $Mn^{4+}$-free fluoride coating may be adjusted by adjusting supply of the additionally introduced first source material such as $H_2SiF_6$, and here, a desired appropriate thickness may be provided such that optical loss is minimized. Also, since the synthesizing process and the coating process are performed as one step within the single HF solution, a process of preparing the fluoride phosphor coated with an inorganic material may be considerably simplified.

In this embodiment, the residual material after the synthesizing process is the second source, but after the fluoride particles are formed, the first source material may also remain. In this case, during the coating process (S145), the second source material containing A, rather than the first source material, may be additionally introduced to provide desired fluoride coating.

Thereafter, in operation S149, the Mn-free fluoride-coated fluoride phosphor may be cleaned.

The cleaning process may be performed multiple times using different solutions. For example, the second source material (e.g., $KHF_2$) may remain on the surface of the fluoride phosphor due to the excessive introduction thereof during the coating process, and the residual second source material may be removed using the HF solution. Subsequently, the HF component may be removed from the fluoride phosphor using acetone.

Figure 15:
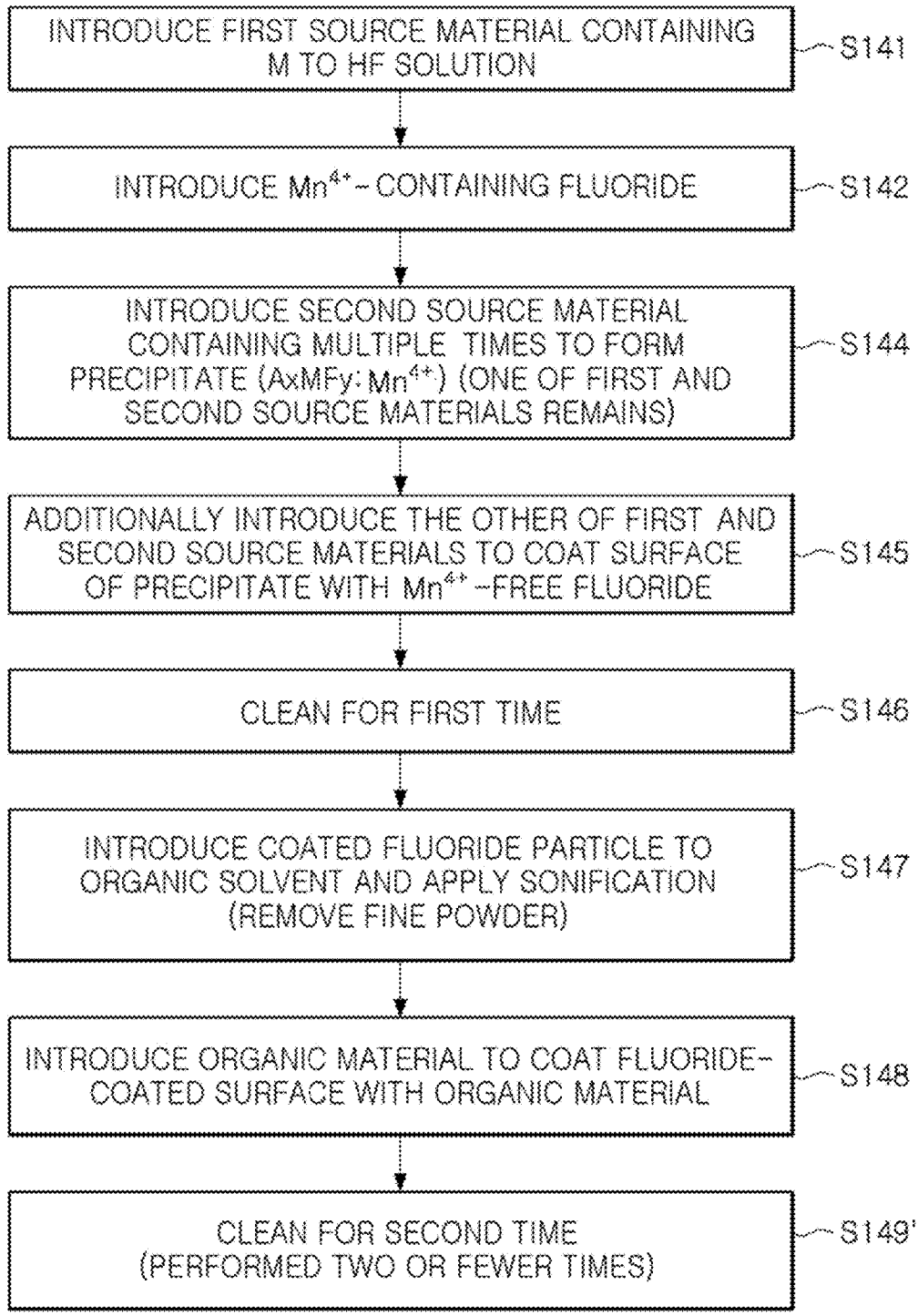
FIG. 15 is a flow chart illustrating a method of manufacturing a fluoride phosphor according to an embodiment.

In addition, the fine powder removing process and the organic coating process may be combined to the preparation method described above with reference to FIG. 14. FIG. 15 illustrates a flow chart of the preparation method.

In FIG. 15, operation S141 to operation S145 may be performed in a manner similar to those of the previous exemplary embodiment (FIG. 14). Also, the first cleaning process in operation S146 may be performed in a manner similar to that of the cleaning process S149 described above with reference to FIG. 14.

After the first cleaning operation S146, the fluoride-coated phosphor may not be dried but introduced to an organic solvent and subjected to sonification in operation S147.

The organic solvent used in this process may be an organic solvent having a polarity equal to or greater than about 4.0. For example, the organic solvent may be at least one selected from among methanol, ethanol, n-propyl alcohol, isopropyl alcohol, n-butyl alcohol, and acetone. Although not limited thereto, sonification may be performed for a few minutes to tens of minutes with a frequency ranging from tens to hundreds of Hz (for example, 40 to 50 Hz).

Subsequently, the fluoride-coated phosphor is introduced together with an organic material to a solvent to coat the fluoride-coated surface with the organic material in operation S148.

As the solvent, a solvent in which the fluoride particles are not damaged and the organic material is sufficiently dispersed may be selected. For example, the solvent may be acetone. The organic material may include a hydrophobic organic material that may be physically adsorbed on surfaces of the fluoride particles. The organic material may include an organic compound having at least one functional group among a carboxyl group (—COOH) and an amine group ($NH_2$) and having 4 to 18 carbon atoms.

In a specific example of this coating process, in order to coat the $K_2SiF_6$:$Mn^{4+}$ phosphor with an organic material, the phosphor and the organic material may be evenly dispersed in acetone. Subsequently, an excessive amount of organic material, together with the phosphor, may be added to the acetone solvent to coat the surface of the phosphor with the organic material. The initially introduced hydrophobic organic material may cover the phosphor such that it is physically adsorbed thereto, and due to the organic material present on the surface of the phosphor, moisture permeation may be reduced. Also, alternatively, the organic coating process may be applied immediately after the synthesizing process S145.

Thereafter, in operation S149', the fluoride phosphor coated with the organic material may be cleaned for a second time. During this cleaning process, a residue created due to the excessive introduction of the organic material may be removed from the fluoride phosphor coated using the acetone solvent. During the previous coating process, since the excessive amount of organic material is introduced, the cleaning process may be performed as necessary. Here, however, if the fluoride phosphor is excessively cleaned, the organic coating on the surface of the phosphor may be affected. Thus, the cleaning process following the organic coating process may be limited to two or fewer times.

Figure 16:
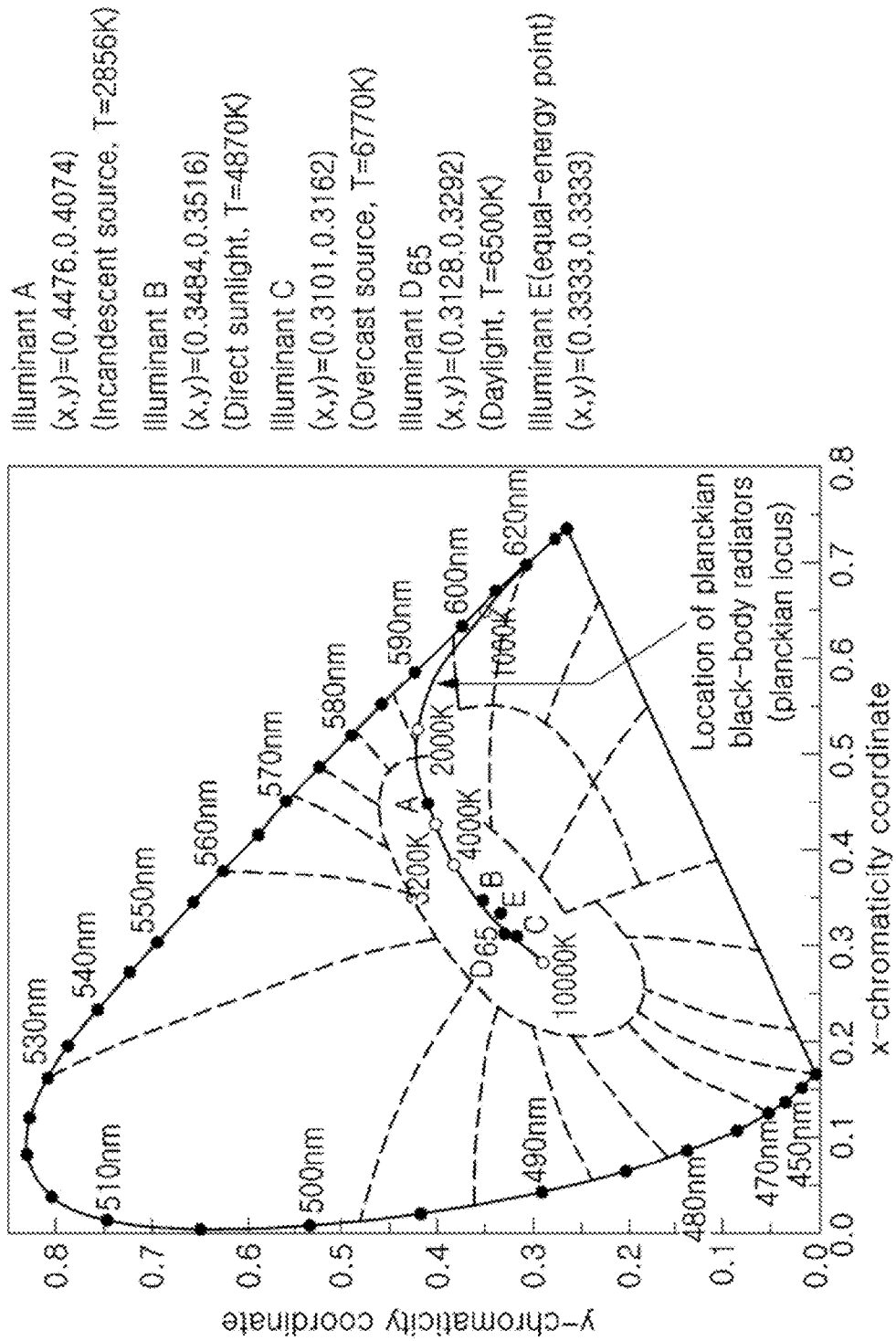
FIG. 16 is a CIE 1931 color space chromaticity diagram illustrating wavelength conversion materials that may be employed in a white light emitting apparatus according to an embodiment.

FIG. 16 is a CIE 1931 color space chromaticity diagram illustrating wavelength conversion materials that may be employed in a white light emitting apparatus according to an embodiment.

When the semiconductor light emitting device emits blue light, the light emitting device package including at least one among yellow, green, and red phosphors may emit white light having various color temperatures according to mixture ratios of the phosphors. For example, a color temperature and a CRI of white light may be adjusted by additionally combining a green and/or a red phosphor with a yellow phosphor.

Referring to the CIE 1931 color space chromaticity diagram illustrated in FIG. 16, white light generated by combining yellow, green, and red phosphors with a UV or blue LED and/or by combining green and red light LEDs therewith, may have two or more peak wavelengths and may be positioned in a segment linking (x, y) coordinates (0.4476, 0.4074), (0.3484, 0.3516), (0.3101, 0.3162), (0.3128, 0.3292), (0.3333, 0.3333) of the CIE 1931 chromaticity diagram of FIG. 16. Alternatively, white light may be positioned in a region surrounded by a spectrum of black body radiation and the segment. A color temperature of white light corresponds to a range from about 2000K to about 20000K.

The following phosphors may be used in the white light emitting apparatus according to embodiments described herein. In case of a red phosphor, the coated fluoride phosphor according to an embodiment described herein may be used. That is, the red phosphor 114 may include a fluoride phosphor expressed as AxMFy:Mn4+ by empirical formula, and at least one of a fluoride coating and an organic coating may be employed as a shell on a surface of the fluoride phosphor. For example, the red phosphor 54 may be a fluoride phosphor such as $K_2SiF_6:Mn^{4+}$, $K_2TiF_6:Mn^{4+}$, $NaYF_4:Mn^{4+}$, and $NaGdF_4:Mn^{4+}$. Also, the following phosphors may be additionally selectively used.

Red phosphor: Red phosphor may additionally include at least one of the red phosphors as follows.

A nitride-based phosphor expressed as $M1AlSiN_x:Re$ ($1 \le x \le 5$), a sulfide-based phosphor expressed as M1D:Re, and a silicate-based phosphor expressed as $(Sr,L)_2SiO_{4-x}N_y$:Eu, where $0<x<4$ and $y=2x/3$. Here, M1 is at least one element selected from among Ba, Sr, Ca, and Mg, D is at least one element selected from among S, Se, and Te, L is at least one element selected from the group consisting of Ba, Sr, Ca, Mg, Li, Na, K, Rb, and Cs, D is at least one element selected from among S, Se, and Te, and Re is at least one element selected from among Y, La, Ce, Nd, Pm, Sm, Gd, Tb, Dy, Ho, Er, Tm, Yb, Lu, F, Cl, Br, and I.

Green phosphor: An oxide-based phosphor expressed as $M_3Al_5O_{12}$ ($Y_3Al_5O_{12}$:Ce, $Tb_3Al_5O_{12}$:Ce, $Lu_3Al_5O_{12}$:Ce), a β-SiALON phosphor, and an oxynitride-based phosphor.

Yellow phosphor: A silicate-based phosphor, a garnet-based phosphor such as YAG or TAG, and a nitride-based phosphor ($La_3Si_6N_{11}$:Ce).

Orange yellow phosphor: A α-SiAlON:Re phosphor.

The foregoing phosphor compositions should basically conform with Stoichiometry, and respective elements may be substituted with different elements of respective groups of the periodic table. For example, strontium (Sr) may be substituted with barium (Ba), calcium (Ca), magnesium (Mg), and the like, of alkali earths, and yttrium (Y) may be substituted with terbium (Tb), lutetium (Lu), scandium (Sc), gadolinium (Gd), and the like. Also, europium (Eu), an activator, may be substituted with cerium (Ce), terbium (Tb), praseodymium (Pr), erbium (Er), ytterbium (Yb), and the like, according to a desired energy level, and an activator may be applied alone, or a coactivator, or the like, may be additionally applied to change characteristics.

Also, phosphors may be replaced with any other wavelength conversion materials such as quantum dots. In a particular wavelength band, and quantum dots may be mixed with phosphors so as to be used or may be used alone. A quantum dot (QD) may have a structure including a core (having a diameter ranging from about 3 nm to about 10 nm) such as CdSe or InP, a shell (having a thickness ranging from about 0.5 nm to about 2 nm) such as ZnS or ZnSe, and a ligand for stabilizing the core and the shell, and may realize various colors according to sizes.

Table 5 below illustrates types of phosphors in applications fields of white light emitting apparatuses using a UV light emitting device (wavelength: 200 nm to 440 nm) or a blue light emitting device (wavelength: 440 nm to 480 nm).

TABLE 5

| Purpose | Phosphor |
| --- | --- |
| LED TV BLU | β-SiAlON:Eu$^{2+}$, (Ca,Sr)AlSiN$_3$:Eu$^{2+}$, La$_3$Si$_6$N$_{11}$:Ce$^{3+}$, K$_2$SiF$_6$:Mn$^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$(0.5 ≤ x ≤ 3, 0 < z < 0.3, 0 < y ≤ 4), K$_2$TiF$_6$:Mn$^{4+}$, NaYF$_4$:Mn$^{4+}$, NaGdF$_4$:Mn$^{4+}$ Ca2SiO4:Eu$^{2+}$, Ca1.2Eu0.8SiO4 |
| Lighting | Lu$_3$Al$_5$O$_{12}$:Ce$^{3+}$, Ca-α-SiAlON:Eu$^{2+}$, La$_3$Si$_6$N$_{11}$:Ce$^{3+}$, (Ca,Sr)AlSiN$_3$:Eu$^{2+}$, Y$_3$Al$_5$O$_{12}$:Ce$^{3+}$, K$_2$SiF$_6$:Mn$^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$ (0.5 ≤ x ≤ 3, 0 < z < 0.3, 0 < y ≤ 4), K$_2$TiF$_6$:Mn$^{4+}$, NaYF$_4$:Mn$^{4+}$, NaGdF$_4$:Mn$^{4+}$, Ca2SiO4:Eu$^{2+}$, Ca1.2Eu0.8SiO4 |
| Side Viewing (Mobile device, Note book computer) | Lu$_3$Al$_5$O$_{12}$:Ce$^{3+}$, Ca-α-SiAlON:Eu$^{2+}$, La$_3$Si$_6$N$_{11}$:Ce$^{3+}$, (Ca,Sr)AlSiN$_3$:Eu$^{2+}$, Y$_3$Al$_5$O$_{12}$:Ce$^{3+}$, (Sr, Ba, Ca,Mg)$_2$SiO$_4$:Eu$^{2+}$, K$_2$SiF$_6$:Mn$^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$(0.5 ≤ x ≤ 3, 0 < z < 0.3, 0 < y ≤ 4), K$_2$TiF$_6$:Mn$^{4+}$, NaYF$_4$:Mn$^{4+}$, NaGdF$_4$:Mn$^{4+}$, Ca2SiO4:Eu$^{2+}$, Ca1.2Eu0.8SiO4 |
| Electrical components (Headlamps, etc.) | Lu$_3$Al$_5$O$_{12}$:Ce$^{3+}$, Ca-α-SiAlON:Eu$^{2+}$, La$_3$Si$_6$N$_{11}$:Ce$^{3+}$, (Ca,Sr)AlSiN$_3$:Eu$^{2+}$, Y$_3$Al$_5$O$_{12}$:Ce$^{3+}$, K$_2$SiF$_6$:Mn$^{4+}$, SrLiAl$_3$N$_4$:Eu, Ln$_{4-x}$(Eu$_z$M$_{1-z}$)$_x$Si$_{12-y}$Al$_y$O$_{3+x+y}$N$_{18-x-y}$ (0.5 ≤ x ≤ 3, 0 < z < 0.3, 0 < y ≤ 4), K$_2$TiF$_6$:Mn$^{4+}$, NaYF$_4$:Mn$^{4+}$, NaGdF$_4$:Mn$^{4+}$, Ca2SiO4:Eu$^{2+}$, Ca1.2Eu0.8SiO4 |

In an embodiment, a color temperature fitting an ambient atmosphere may be realized by selectively mixing violet, blue, green, red color, orange, and the like, in a white light emitting apparatus (or package). For example, a white light emitting apparatus having a color temperature equal to about 4000K and a white light emitting apparatus and a red light emitting apparatus each having a color temperature equal to about 3000K may be disposed in a single module, and, by controlling an output of each of the apparatuses by independently driving the apparatuses, the color temperature may be adjusted within a range from about 2000K to about 4000K. Also, a white light emitting module having a color rendering index (Ra) ranging from about 85 to about 99 may be manufactured.

In another example, a white light emitting apparatus having a color temperature equal to about 5000K and a white light emitting apparatus having a color temperature equal to about 2700K may be disposed in a single module, and, by controlling an output of each of the white light emitting apparatuses by independently driving the white light emitting apparatuses, the color temperature may be adjusted within a range from about 2700K to about 5000K. Also, a white light emitting module having a color rendering index (Ra) ranging from about 85 to about 99 may be manufactured.

The number of light emitting apparatuses may vary according to set values of a basic color temperature. When a set value of the basic color temperature is about 4000K, the number of light emitting apparatuses corresponding to the color temperature 4000K may be greater than the number of light emitting apparatuses having a color temperature equal to about 3000K or the number of red light emitting apparatuses.

Figure 25:
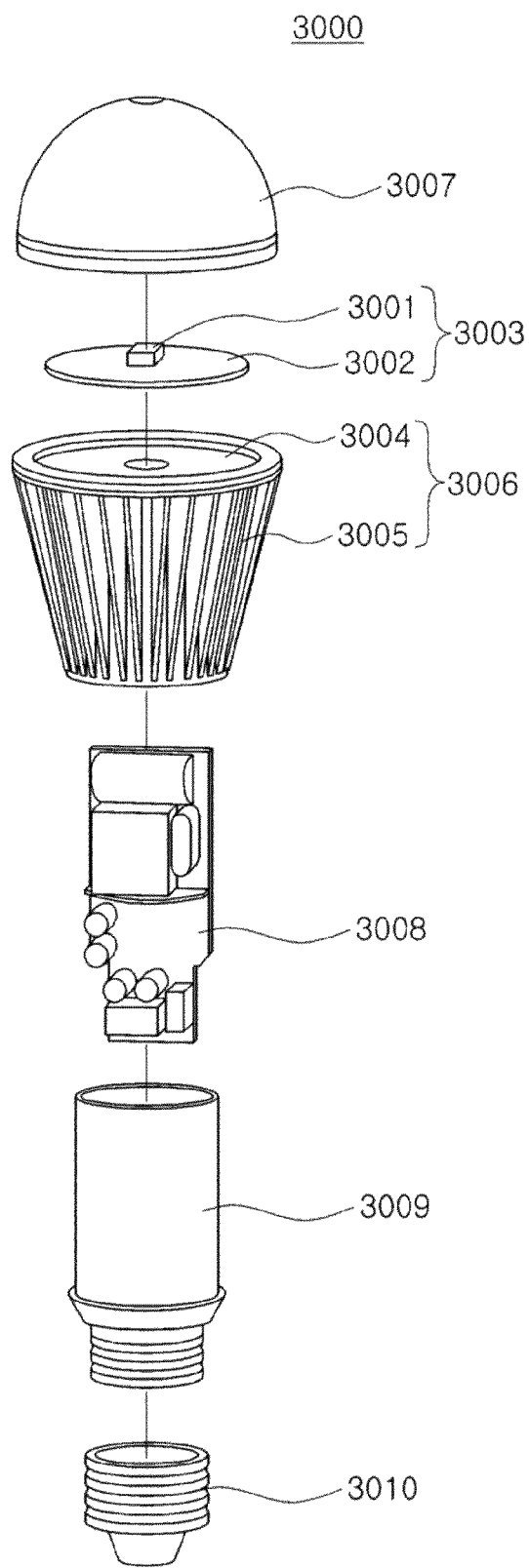
FIG. 25 is an exploded perspective view illustrating a bulb-type lighting device according to an embodiment.

In this manner, the module adjustable in the CRI and having an adjustable color temperature may be used in a lighting device, such as the lighting device illustrated in FIG. 25, and the semiconductor light emitting apparatus (or module) may include the fluoride phosphor prepared according to one or more of the embodiments described above may be advantageously applied to various products.

Figure 17A:
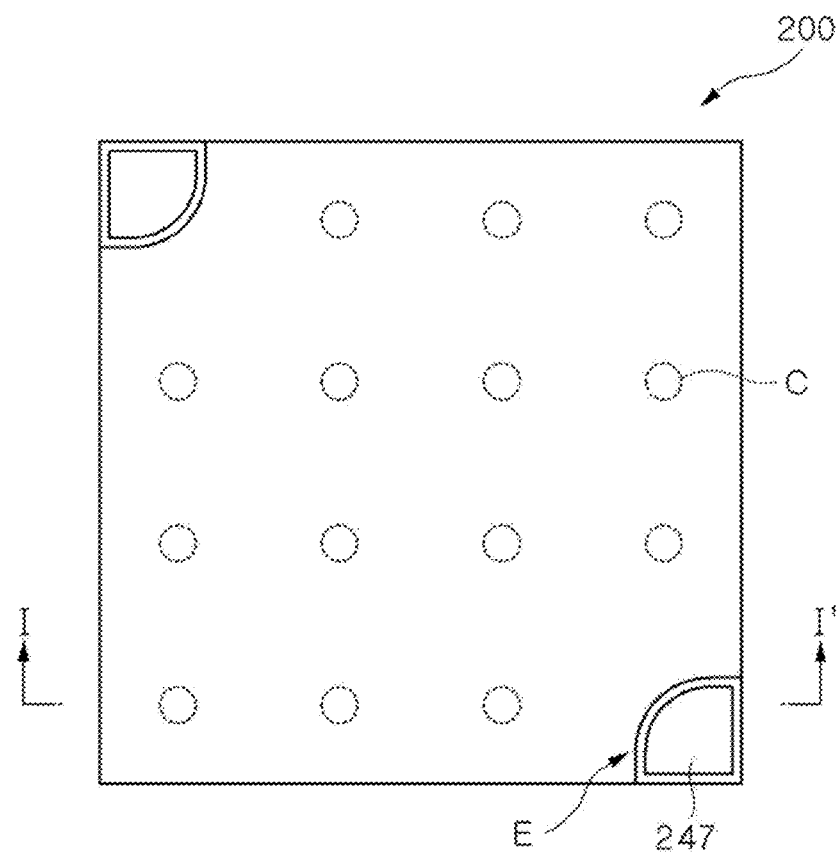
FIGS. 17A and 17B are a plan view and a cross-sectional view illustrating examples of a semiconductor light emitting device employable in a white light emitting apparatus according to an embodiment.
Figure 17B:
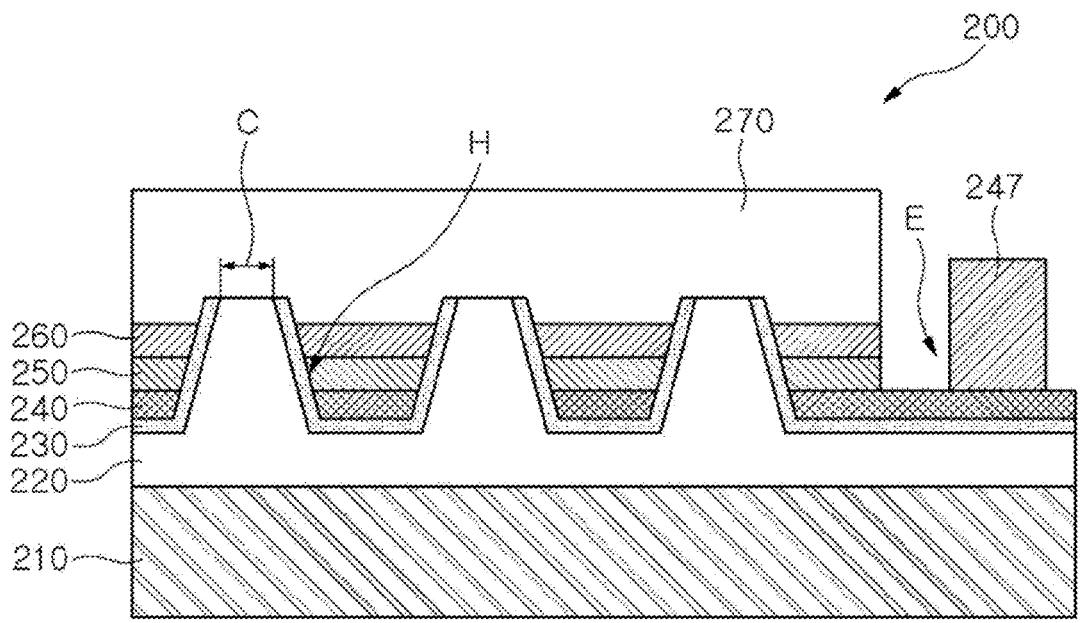

Various types of semiconductor light emitting devices may be used in the white light emitting apparatus according to various embodiments. FIGS. 17A and 17B are a plan view and a cross-sectional view illustrating an example of a light emitting device that may be employed in an exemplary embodiment. FIG. 17B is a cross-sectional view taken along line I-I' of FIG. 17A.

Referring to FIGS. 17A and 17B, a semiconductor light emitting device 200 according to this embodiment includes a conductive substrate 210, a first electrode 220, an insulating layer 230, a second electrode 240, a second conductivity-type semiconductor layer 250, an active layer 260, and a first conductivity-type semiconductor layer 270, and these layers are sequentially stacked. The first and second conductivity-type semiconductor layers 270 and 250 may be a p-type nitride semiconductor layer and an n-type nitride semiconductor layer, respectively.

The conductive substrate 210 may be a metal substrate or a semiconductor substrate having electrical conductivity. For example, the conductive substrate 210 may be a metal substrate including any one among Au, Ni, Cu, and W, or a semiconductor substrate including any one among Si, Ge, and GaAs.

The first electrode 220 is disposed on the conductive substrate 210. A contact hole H is disposed on the conductive substrate 210. The contact hole H may extend to a predetermined region of the first conductivity-type semiconductor layer 270 by penetrating through the second electrode 240, the second conductivity-type semiconductor layer 250, and the active layer 260. A portion of the first electrode 220 may be connected to the first conductivity-type semiconductor layer 270 through the contact hole H. Accordingly, the conductive substrate 210 and the first conductivity-type semiconductor layer 270 may be electrically connected.

The second electrode 240 is disposed to be connected to the second conductivity-type semiconductor layer 250. The second electrode 240 may be electrically insulated from the first electrode 220 by an insulating layer 230. As illustrated in FIG. 17B, the insulating layer 230 is formed on a side surface of the contact hole H as well as between the first electrode 220 and the second electrode 240. Thus, the second electrode 240, the second conductivity-type semiconductor layer 250, and the active layer 260 exposed to the side wall of the contact hole H may be insulated from the first electrode 220.

A contact region C of the first conductivity-type semiconductor layer 270 is exposed by the contact hole H, and a portion of the first electrode 220 may be formed to be in contact with the contact region C through the contact hole H.

As illustrated in FIG. 17B, a portion of the second electrode 240 extends to a perimeter of the semiconductor laminate to provide an electrode formation region E. The electrode formation region E may include an electrode pad unit 247 for connecting an external power source to the second electrode 240. A single electrode formation region E is illustrated, but if necessary, multiple electrode formation regions may be provided. As illustrated in FIG. 17A, the electrode formation region E may be formed in one corner of the semiconductor light emitting device 200 in order to maximize a light emission area. The second electrode 240 may be formed of a material which is in ohmic-contact with the second conductivity-type semiconductor layer 250 and has a relatively high reflectivity. As a material of the second electrode 240, the reflective electrode material described above may be used.

Figure 18:
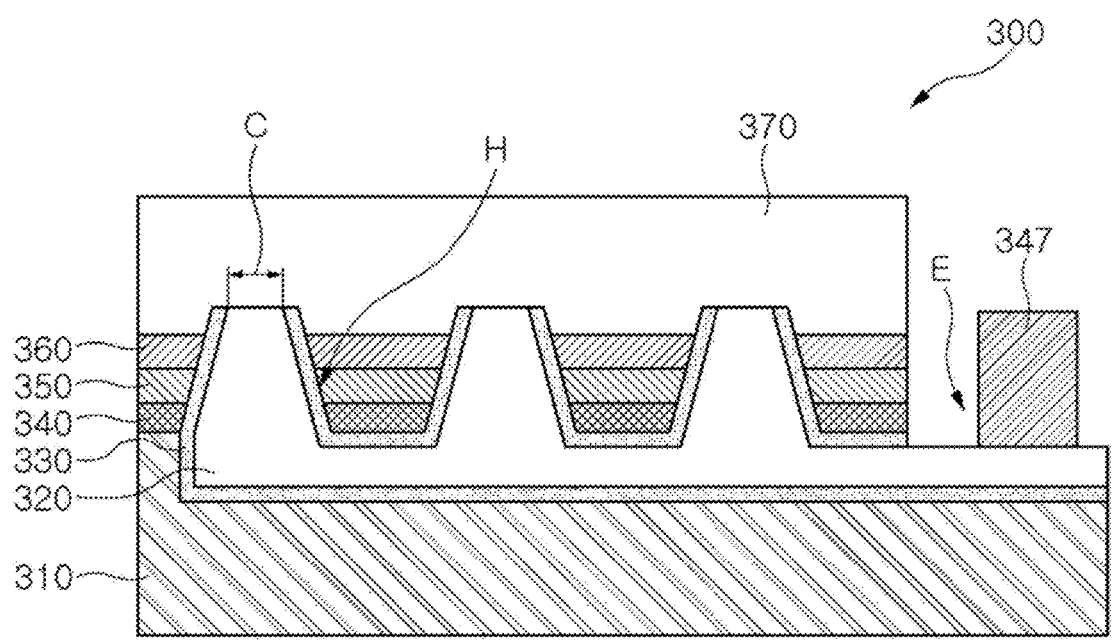
FIG. 18 is a cross-sectional view illustrating another example of a semiconductor light emitting device employable in a white light emitting apparatus according to an embodiment.

In a nitride semiconductor light emitting device 300 illustrated in FIG. 18, a first electrode 320 connected to a first conductivity-type semiconductor layer 370 may be exposed, unlike the nitride semiconductor light emitting device 200 illustrated in FIG. 17B.

Similar to the previous example, the nitride semiconductor light emitting device 300 illustrated in FIG. 18 includes a conductive substrate 310 and a semiconductor laminate positioned on the conductive substrate 310 and having a second conductivity-type semiconductor layer 350, an active layer 360, and a first conductivity-type semiconductor layer 370. A second electrode 340 may be disposed between the second conductivity-type semiconductor layer 350 and the conductive substrate 310.

A contact hole H is formed in the semiconductor laminate and a contact region C of the first conductivity-type semiconductor layer 370 is exposed, and the contact region C may be connected to a portion of the first electrode 320. The first electrode 320 may be electrically separated from the active layer 360, the second conductivity-type semiconductor layer 350, the second electrode 340, and the conductive substrate 310 by an insulating layer 330.

Unlike the previous example, a portion of the first electrode 320 may extend to a perimeter to provide an electrode formation region E, and an electrode pad unit 347 may be formed on the electrode formation region E. The second electrode 340 may be directly connected to the conductive substrate 310 so that the conductive substrate 310 may be provided as an electrode connected to the second conductivity-type semiconductor layer 350.

Figure 19:
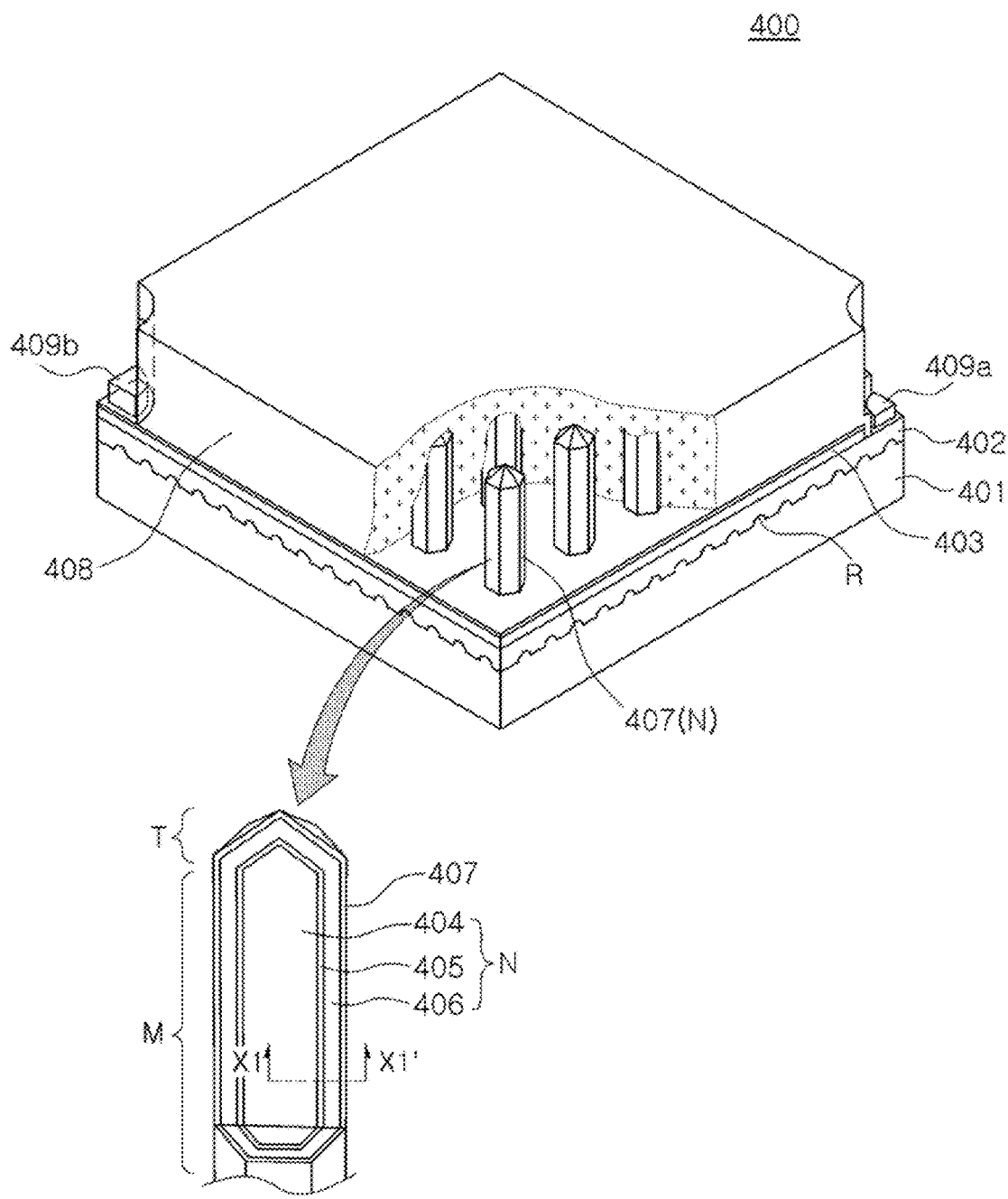
FIG. 19 is a perspective view schematically illustrating another example of a semiconductor light emitting device employable in a white light emitting apparatus according to an embodiment.

FIG. 19 is a perspective view schematically illustrating a nanostructure semiconductor light emitting device employable in a light emitting apparatus according to an embodiment.

Referring to FIG. 19, a nanostructure semiconductor light emitting device 400 may include a base layer 402 formed of a first conductivity-type semiconductor material and multiple light emitting nanostructures N formed on the base layer 402.

The nanostructure semiconductor light emitting device 400 may include a substrate 401 having an upper surface on which the base layer 402 is disposed. An irregular pattern R may be formed on the upper surface of the substrate 401. The irregular pattern R may enhance quality of a single crystal grown thereon, while improving light extraction efficiency. The substrate 401 may be an insulating, conductive, or semiconductor substrate. For example, the substrate 401 may be formed of sapphire, SiC, Si, $MgAl_2O_4$, MgO, $LiAlO_2$, $LiGaO_2$, or GaN.

The base layer 402 may include a first conductivity-type semiconductor layer and provide a growth surface for the light emitting nanostructures N. The base layer 402 may be a nitride semiconductor satisfying $Al_xIn_yGa_{1-x-y}N$, where $0 \leq x \leq 1$, $0 \leq y \leq 1$, and $0 \leq x+y \leq 1$, and may be doped with an n-type impurity such as silicon (Si). For example, the base layer 402 may be an n-type GaN.

An insulating layer 403 having openings may be formed on the base layer 402, and the openings may be provided to facilitate growth of the light emitting nanostructures N (in particular, nanocores 404). The nanocores 404 may be formed on regions of the base layer 402 exposed by the openings. The insulating layer 403 may be used as a mask for growing the nanocores 404. The insulating layer 403 may be formed of an insulating material such as $SiO_2$ or $SiN_x$.

The light emitting nanostructure N may include a main portion M having a hexagonal prism structure and a tip portion T positioned on the main portion M. The main portion M of the light emitting nanostructure N may have side surfaces, each of which being the same crystal plane, and the tip portion T of the light emitting nanostructure N may have a crystal plane different from that of the side surfaces of the light emitting nanostructure N. The tip portion T of the light emitting nanostructure N may have a hexagonal pyramid shape. Such a division of the nanostructure may be determined by the nanocore 404 in actuality, and the nanocore 404 may be understood as being divided into the main portion M and the tip portion T.

The light emitting nanostructure N may include the nanocore 404 formed of a first conductivity-type nitride semiconductor and an active layer 405 and a second conductivity-type nitride semiconductor layer 406 sequentially formed on a surface of the nanocore 404.

The nanostructure semiconductor light emitting device 400 may include a contact electrode 407 connected to the second conductivity-type nitride semiconductor layer 406. The contact electrode 407 employed in the present exemplary embodiment may be formed of a transparent conductive material.

An insulating protective layer 408 may be formed on upper surfaces of the light emitting nanostructures N. The insulating protective layer 408 may be a passivation layer for protecting the light emitting nanostructures N. Also, the insulating protective layer 408 may be formed of a light transmissive material allowing light generated by the light emitting nanostructures N to be extracted.

The nanostructure semiconductor light emitting device 400 may include first and second electrodes 409a and 409b. The first electrode 409a may be disposed on an exposed region of the base layer 402 formed of the first conductivity-type semiconductor. Also, the second electrode 409b may be disposed on an exposed portion of an extended region of the contact electrode 407.

Figure 20:
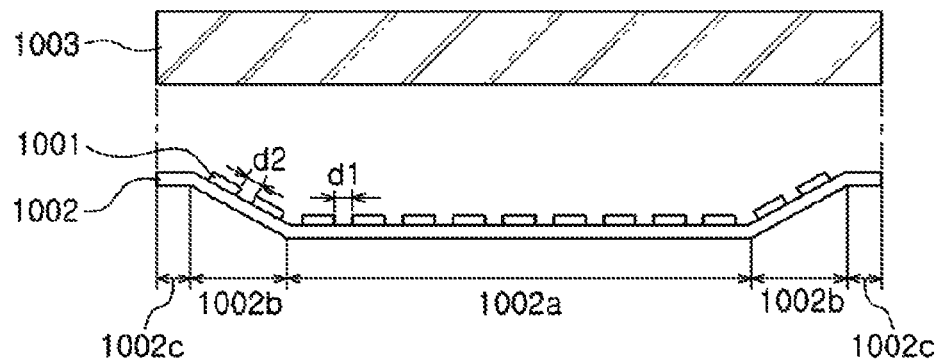
FIGS. 20 and 21 are cross-sectional views illustrating backlight units according to various embodiments.
Figure 21:
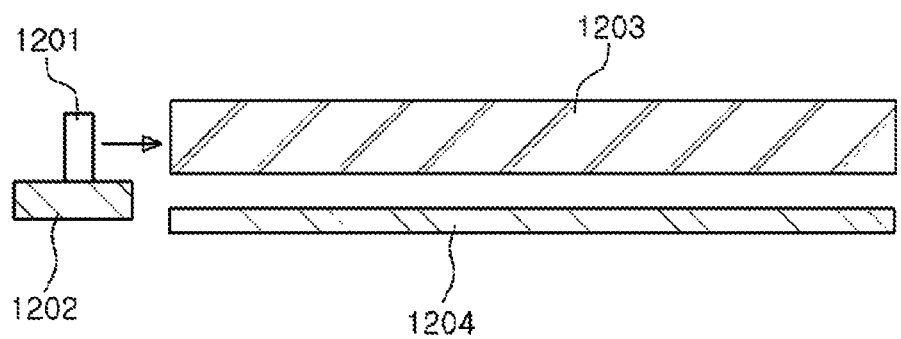

FIGS. 20 and 21 are views illustrating examples of backlight units employing a semiconductor light emitting device according to an embodiment.

Referring to FIG. 20, a backlight unit 1000 includes at least one light source 1001 mounted on a circuit board 1002 and at least one optical sheet 1003 disposed thereabove.

The optical source 1001 may include a white light emitting apparatus containing a fluoride phosphor prepared according to one or more of the embodiments described above. The circuit board 1002 may have a first planar portion 1002a corresponding to a main region, a sloped portion 1002b disposed around the first planar portion 1002a and bent in at least a portion thereof, and a second planar portion 1002c disposed on the edge of the circuit board 1002, namely, an outer side of the sloped portion 1002b. The light sources 1001 may be arranged at a first interval d1 on the first planar portion 1002a, and one or more light sources 1001 may be arranged at a second interval d2 on the sloped portion 1002b. The first interval d1 may be equal to the second interval d2. A width of the sloped portion 1002b (or a length in the cross-section) may be smaller than that of the first planar portion 1002a and may be larger than a width of the second planar portion 1002c. Also, if necessary, at least one light source 1001 may be arranged on the second planar portion 1002c.

A slope of the sloped portion 1002b may be appropriately adjusted within a range of about 0 degrees to about 90 degrees with respect to the first planar portion 1002a, and with this structure, the circuit board 1002 may maintain a substantially uniform brightness, including in the vicinity of the edge of the optical sheet 1003.

Unlike the backlight unit 1000 illustrated in FIG. 20 in which the light sources 1001 may be configured to emit light toward a liquid crystal display (LCD) disposed thereabove, a backlight unit 1200 as another example illustrated in FIG. 21 may be configured such that a light source 1201 mounted on a substrate 1202 may be configured to emit light in a lateral direction, and the emitted light may be incident on a light guide plate 1203 so as to be changed into as a surface light source. The light travelling to the light guide plate 1203 may be emitted upwards, and in order to enhance light extraction efficiency, a reflective layer 1204 may be disposed below the light guide plate 1203.

Unlike some embodiments described above, a phosphor may be disposed in a different component of a backlight unit, rather than being directly disposed in a semiconductor light emitting device or package. Examples of such embodiments are illustrated in FIGS. 22, 23A, and 23B.

Figure 22:
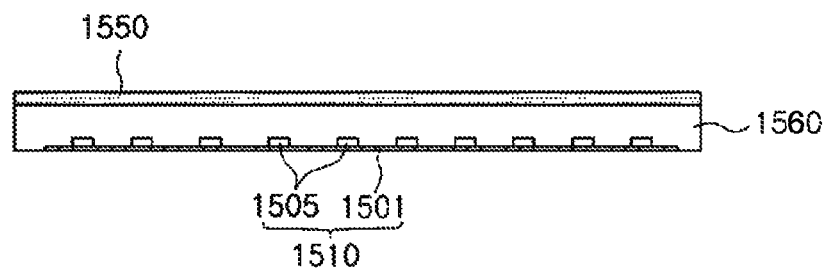
FIG. 22 is a cross-sectional view illustrating a direct type backlight unit according to an embodiment.

As illustrated in FIG. 22, a direct type backlight unit 1500 may include a phosphor film 1550 and one or more light source modules 1510 arranged on a lower surface of the phosphor film 1550. The phosphor film 1550 may include at least the fluoride phosphor prepared according to an embodiment described herein.

The backlight unit 1500 illustrated in FIG. 22 may include a bottom case 1560 accommodating the light source modules 1510. In this embodiment, the phosphor film 1550 is disposed on an upper surface of the bottom case 1560. At least a partial mount of light emitted from the light source modules 1510 may be wavelength-converted by the phosphor film 1550. The phosphor film 1550 may be manufactured as a separate film and applied, or may be provided in the form of being integrally coupled with a light diffuser. The light source modules 1510 may be LED light source modules and may include a circuit board 1501 and multiple semiconductor light emitting devices 1505 mounted on an upper surface of the circuit board 1501. The semiconductor light emitting apparatuses in this embodiment may, but need not be semiconductor light emitting apparatuses without a phosphor.

Figure 23A:
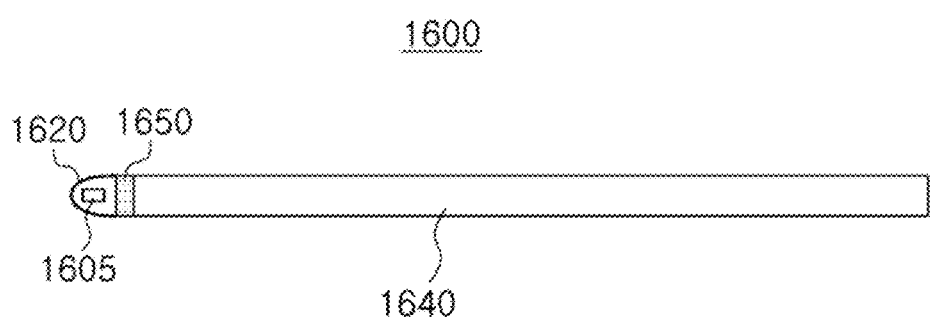
FIGS. 23A and 23B are cross-sectional views illustrating edge type backlight units according to an embodiment.
Figure 23B:
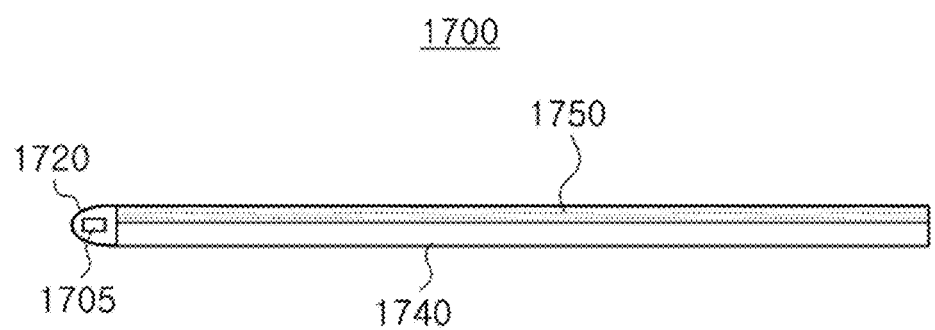

FIGS. 23A and 23B illustrate an edge-type backlight unit according to another embodiment.

An edge-type backlight unit 1600 illustrated in FIG. 23A may include a light guide plate 1640 and a semiconductor light emitting apparatus 1605 disposed on one side of the light guide plate 1640. Light emitted from the semiconductor light emitting apparatus 1605 may be guided to the interior of the light guide plate 1640 by a reflective structure 1620. In this embodiment, a phosphor film 1650 may include a fluoride phosphor prepared according to one or more of the embodiments described herein and may be positioned between a side surface of the light guide plate 1640 and the semiconductor light emitting apparatus 1605.

Similar to the edge-type backlight unit 1600 of FIG. 23A, an edge-type backlight unit 1700 illustrated in FIG. 23B may include a light guide plate 1740, and a semiconductor light emitting apparatus 1705 and a reflective structure 1720 disposed on one side of the light guide plate 1740. The phosphor film 1750 may include a fluoride phosphor according to an embodiment and is illustrated as being applied to a light emitting surface of the light guide plate 1740.

In this manner, the fluoride phosphor prepared according to one or more embodiments may be applied to other elements such as the backlight unit, or the like, rather than being directly applied to a semiconductor light emitting apparatus.

Figure 24:
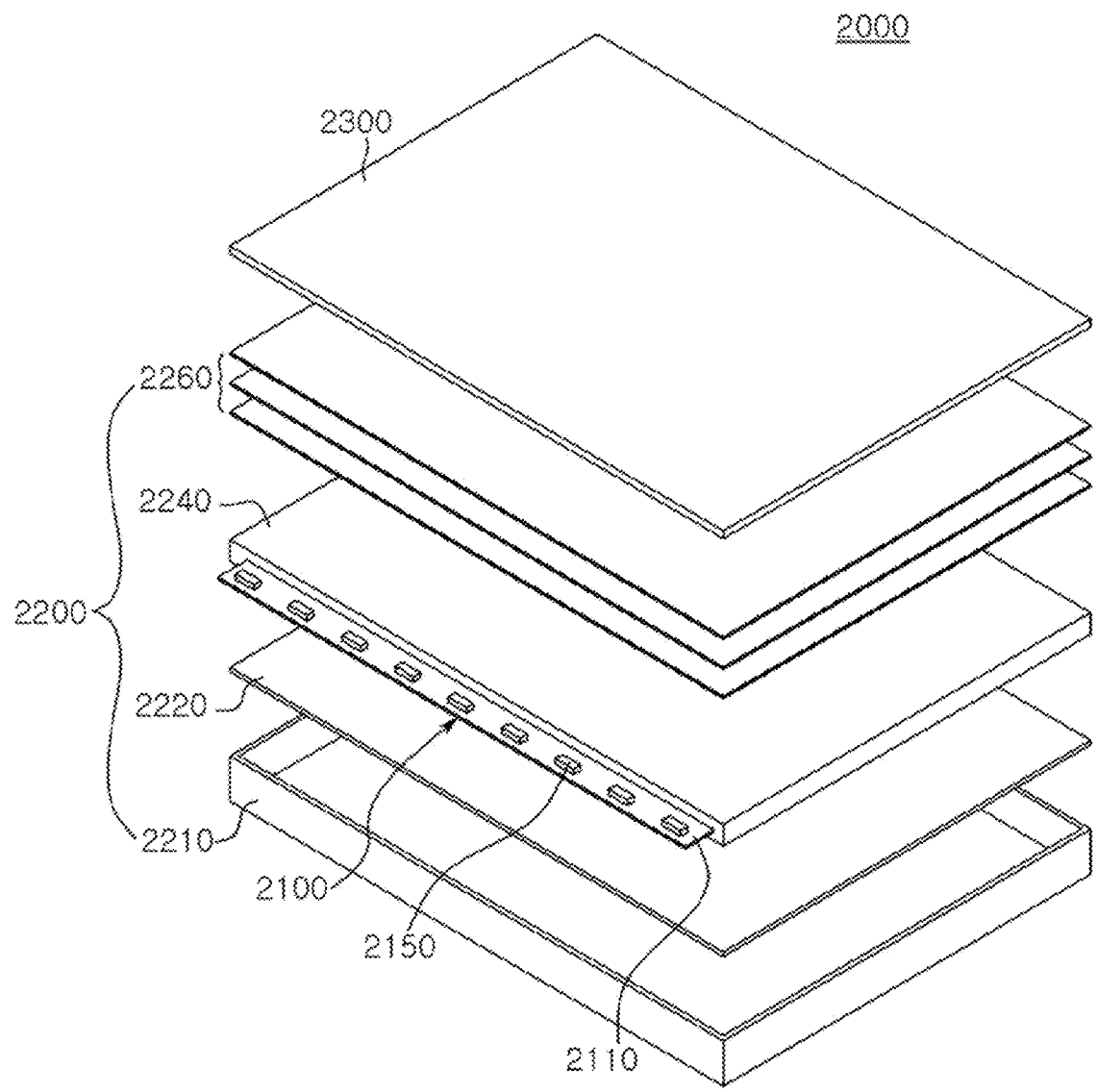
FIG. 24 is an exploded perspective view illustrating a display apparatus according to an embodiment.

FIG. 24 is an exploded perspective view illustrating a display apparatus according to an embodiment.

Referring to FIG. 24, a display apparatus 2000 includes a backlight unit 2200 and an image display panel 2300 such as a liquid crystal display panel. The backlight unit 2200 may include a light guide plate 2240 and an LED light source module 2100 provided on at least one side of the light guide plate 2240.

In this embodiment, as illustrated, the backlight unit 2200 may further include a bottom case 2210 and a reflective plate 2220 positioned below the light guide plate 2240.

In order meet to demand for various optical characteristics, various types of optical sheets 2260 such as a light diffusion sheet, a prism sheet, and a protective sheet may be provided between the light guide plate 2240 and the liquid crystal display panel 2300.

The LED light source module 2100 includes a circuit board 2110 provided on at least one side of the light guide plate 2240 and multiple semiconductor light emitting apparatuses 2150 mounted on the circuit board 2110 and providing light to be incident on the light guiding plate 2240. The semiconductor light emitting apparatuses 2150 may be a package including a coated fluoride phosphor. The semiconductor light emitting apparatuses 2150 may be mounted on a side adjacent to a light emitting surface, forming a side-view light emitting device package.

FIG. 25 is an exploded perspective view illustrating a bulb-type lighting device according to an embodiment.

A lighting device 3000 is illustrated, for example, as a bulb-type lamp in FIG. 25, and includes a light emitting module 3003, a driving unit 3008, and an external connection unit 3010. Also, the lighting device 3000 may further include external structures such as external and internal housings 3006 and 3009 and a cover unit 3007.

The light emitting module 3003 may include an LED light source 3001 as the foregoing semiconductor light emitting apparatus and a circuit board 3002 on which the light source 3001 is mounted. For example, the first and second electrodes of the aforementioned semiconductor light emitting device may be electrically connected to an electrode pattern of the circuit board 3002. In this embodiment, it is illustrated that a single light source 3001 is mounted on the circuit board 3002, but multiple light sources may be mounted as desired. Also, the LED light source 3001 may include a fluoride phosphor prepared according to one or more of the embodiments described herein.

The external housing 3006 may serve as a heat dissipation unit and may include a heat dissipation plate 3004 disposed to be in direct contact with the light emitting module 3003 to enhance heat dissipation and heat dissipation fins 3005 surrounding the side surfaces of the lighting device 3000. Also, the cover unit 3007 may be installed on the light emitting module 3003 and may have a convex lens shape. The driving unit 3008 is installed in the internal housing 3009 and connected to the external connection unit 3010 having a socket structure to receive power from an external power source.

Also, the driving unit 3008 may serve to convert power into an appropriate current source for driving the semiconductor light emitting device 3001 of the light emitting module 3003, and provide the same. For example, the driving unit 3008 may be configured as an AC-DC converter, a rectifying circuit component, or the like.

An embodiment includes a method of manufacturing a fluoride phosphor having improved optical properties and reliability.

An embodiment includes a light emitting apparatus having a fluoride phosphor and having enhanced optical properties and reliability, a display apparatus, and a lighting device.

In an embodiment, a method of manufacturing a fluoride phosphor may include: preparing a hydrofluoric (HF) solution in which a first source material containing M and a fluoride containing $Mn^{4+}$ are dissolved, forming fluoride particles satisfying $A_xMF_y:Mn^{4+}$ by dividedly introducing a second source material containing A to the HF solution a plurality of times, wherein M is at least one selected from the group consisting of silicon (Si), titanium (Ti), zirconium (Zr), hafnium (Hf), germanium (Ge), and tin (Sn), A is at least one selected from the group consisting of lithium (Li), natrium (Na), kalium (K), rubidium (Rb), and cesium (Cs), a compositional ratio (x) of A satisfies $2 \le x \le 3$, and a compositional ratio (y) of F satisfies $4 \le y \le 7$.

The forming of the fluoride particles may include forming fluoride seeds satisfying $A_xMF_y:Mn^{4+}$ by a primary introduction of the second source material, and growing the fluoride seeds to form fluoride particles having a desired particle size by a secondary introduction of the second source material.

An amount of the second source material introduced in the primary introduction may range from 5 to 30 wt % of the overall input amount of the second source material. An interval between the primary introduction and the secondary introduction may range from 5 to 30 minutes.

The secondary introduction of the second source material may be dividedly performed a plurality of times. For example, the secondary introduction of the second source material is dividedly performed at least three times. An interval between the dividedly performed introduction of the second introduction may be at least three minutes.

A mass median diameter (d50) of the fluoride particle may range from 5 to 25 μm. A quartile deviation (Q.D.) of a size distribution of the fluoride particles may be equal to or less than 0.2.

The method may further include cleaning the fluoride particles, and removing fine powder from the surfaces of the fluoride particles by introducing the cleaned fluoride particles to an organic solvent and then performing a sonification process thereon.

The preparing of the HF solution may include: introducing the first source material containing M to the HF solution; and introducing the fluoride containing $Mn^{4+}$ to the HF solution to which the first source material has been introduced.

After the forming of the fluoride particles, the second source material may remain, and the method may further include additionally introducing the first source material to coat the fluoride particles with an Mn-free fluoride.

The method may further include, after forming the fluoride particles, cleaning the fluoride particles, and introducing the cleaned fluoride particles and an organic material to a solvent to coat surfaces of the fluoride particles with the organic material. The solvent may be acetone, and the organic material may include a hydrophobic organic material physically adsorbable to a surface of the fluoride phosphor.

The $Mn^{4+}$-containing fluoride may include a manganese fluoride having an $A_xMnF_y$ composition. The first source material may include at least one selected from the group consisting of $H_xMF_y$, $A_xMF_y$, and $MO_2$. The second source material may include $AHF_2$.

According to an embodiment, a method of manufacturing a fluoride phosphor may include: preparing a hydrofluoric (HF) solution in which a first source material containing M and a fluoride containing $Mn^{4+}$ are dissolved, forming fluoride seeds satisfying $A_xMF_y:Mn^{4+}$ by primarily introducing a second source material containing A to the HF solution, growing the fluoride seeds to form fluoride particles having a desired particle size by secondarily introducing the second source material to the HF solution, cleaning the fluoride particles, and removing fine powder from surfaces of the fluoride particles by introducing the cleaned fluoride particles to an organic solvent and performing sonification thereon, wherein M is at least one selected from the group consisting of silicon (Si), titanium (Ti), zirconium (Zr), hafnium (Hf), germanium (Ge), and tin (Sn), A is at least one selected from the group consisting of lithium (Li), natrium (Na), kalium (K), rubidium (Rb), and cesium (Cs), a compositional ratio (x) of A satisfies $2 \leq x \leq 3$, and a compositional ratio (y) of F satisfies $4 \leq y \leq 7$.

The organic solvent may have a polarity equal to or greater than 4.0. The organic solvent may include at least one selected from the group consisting of methanol, ethanol, n-propyl alcohol, isopropyl alcohol, n-butyl alcohol, and acetone.

In an embodiment, a method of manufacturing a fluoride phosphor may include introducing a first source material containing M to a hydrofluoric (HF) solution, introducing a fluoride containing $Mn^{4+}$ to the HF solution, dividedly introducing a second source material containing A to the HF solution a plurality of times to form fluoride particles satisfying $A_xMF_y:Mn^{4+}$, any one of the first and second source materials remaining after the fluoride particles are formed, and additionally introducing the other of the first and second source materials to the HF solution in which the fluoride particles have been formed, to coat the fluoride particles with an Mn-free fluoride, wherein M is at least one selected from the group consisting of silicon (Si), titanium (Ti), zirconium (Zr), hafnium (Hf), germanium (Ge), and tin (Sn), A is at least one selected from the group consisting of lithium (Li), natrium (Na), kalium (K), rubidium (Rb), and cesium (Cs), a compositional ratio (x) of A satisfies $2 \leq x \leq 3$, and a compositional ratio (y) of F satisfies $4 \leq y \leq 7$.

In an embodiment, a white light emitting apparatus may include: a semiconductor light emitting device emitting excitation light, a fluoride phosphor disposed around the semiconductor light emitting device, and converting a wavelength of at least a portion of the excitation light into red light, and prepared by any one of the preparation methods described above, and at least one light emitting element providing light having a wavelength different from a wavelength of light emitted from the semiconductor light emitting device and a wavelength of the red light, wherein the at least one light emitting element may be at least one among a further semiconductor light emitting device and a further phosphor.

In an embodiment, a display apparatus may include an image display panel displaying an image; and a backlight unit providing light to the image display panel and having a light emitting diode (LED) light source module, wherein the LED light source module includes a circuit board and the white light emitting apparatus mounted on the circuit board.

In an embodiment, a lighting device may include a light emitting diode (LED) light source module, and a light diffusion sheet disposed on the LED light source module and uniformly diffusing light emitted by the LED light source module, wherein the LED light source module includes a circuit board and the white light emitting apparatus mounted on the circuit board.

As set forth above, according to various embodiments, an improved method of synthesizing a fluoride phosphor capable of controlling a particle size of a phosphor is provided. By more precisely controlling a particle size, quantum efficiency may be improved and high luminance of a semiconductor light emitting package may be guaranteed. In particular, since a shell formation process such as fluoride coating may be combined in a continuous process, a coated fluoride phosphor having a desired particle size may be provided.

Also, by removing undesired fine powder from the surface of a $Mn^{4+}$-containing fluoride phosphor by applying sonification, higher reliability may be achieved even in a high temperature, high humidity environment.

While particular embodiments have been shown and described above, it will be apparent to those skilled in the art that modifications and variations could be made without departing from the scope as defined by the appended claims.

What is claimed is:

1. A method of manufacturing a fluoride phosphor, the method comprising,
    preparing a hydrofluoric (HF) solution dissolving a first source material containing M, where M is at least one selected from the group consisting of silicon (Si), titanium (Ti), zirconium (Zr), hafnium (Hf), germanium (Ge) and tin (Sn), and a fluoride containing $Mn^{4+}$; and
    forming fluoride particles by introducing a second source material containing A, where A is at least one selected from the group consisting of lithium (Li) sodium (Na) potassium (K), rubidium (Rb), and cesium (Cs), to the HF solution in each of a plurality of instances,
    where the fluoride particles have a chemical formula of $A_xMF_y:Mn^{4+}$;
    a compositional ratio (x) of A satisfies $2 \leq x \leq 3$; and
    a compositional ratio (y) of F satisfies $4 \leq x \leq 7$, and wherein the introducing of the second source material to the HF solution is repeated until a quartile deviation (Q.D.) of a size distribution of the fluoride particles is equal or less than 0.2.

2. The method of claim 1,
wherein the $Mn^{4+}$-containing fluoride includes a manganese fluoride having an $A_xMnF_y$ composition.

3. The method of claim 1,
wherein the first source material containing M includes at least one selected from the group consisting of $H_xMF_y$, $A_xMF_y$, and $MO_2$.

4. The method of claim 1,
wherein the second source material containing A includes $AHF_2$.

5. The method of claim 1,
wherein a number of the instances of introducing the second source material is greater than or equal to four,
wherein fluoride seeds form in a first instance of the instances,
wherein the fluoride seeds grow to the fluoride particles in remaining instances of the instances.

6. The method of claim 1,
wherein the forming of the fluoride particles includes:
forming fluoride seeds by a primary introduction of the second source material; and
growing the fluoride seeds to form the fluoride particles by at least one secondary introduction of the second source material.

7. The method of claim 6,
wherein an amount of the second source material introduced in the primary introduction ranges from 5 to 30 wt % of a total amount of the second source material.

8. The method of claim 6,
wherein an interval between the primary introduction and the at least one secondary introduction ranges from 5 to 30 minutes.

9. The method of claim 6, wherein the at least one secondary introduction of the second source material comprises a plurality of secondary introductions of the second source material.

10. The method of claim 9, wherein a number of the secondary introductions of the second source material is greater than or equal to three.

11. The method of claim 1, wherein introducing the second source material to the HF solution is repeated until a mass median diameter (d50) of the fluoride particles ranges from about 5 to about 25 μm.

12. The method of claim 1, further comprising:
cleaning the fluoride particles; and
removing fine powder from surfaces of the fluoride particles by introducing the cleaned fluoride particles to an organic solvent and performing a sonification process thereon.

13. The method of claim 1, wherein the preparing of the HF solution includes:
introducing the first source material to the HF solution; and
introducing the fluoride containing $Mn^{4+}$ to the HF solution to which the first source material has been introduced.

14. The method of claim 1, further comprising:
if one of the first and second source materials is in excess after the forming of the fluoride particles, additionally introducing the other of the first and second source materials to the HF solution with the one of the first and second source material in excess to coat the fluoride particles with an Mn-free fluoride.

15. The method of claim 1, further comprising:
after forming the fluoride particles, cleaning the fluoride particles; and
introducing the cleaned fluoride particles and an organic material to a solvent to coat surfaces of the fluoride particles with the organic material.

16. A method of manufacturing a fluoride phosphor, the method comprising:
introducing a first source material containing M to a hydrofluoric (HF) solution;
introducing a fluoride containing $Mn^{4+}$ to the HF solution;
dividedly introducing a second source material containing A to the HF solution a plurality of times to form fluoride particles satisfying $A_xMF_y$:$Mn^{4+}$; and
if one of the first and second source materials is in excess after the fluoride particles are formed, additionally introducing the other of the first and second source materials to the HF solution in which the fluoride particles have been formed, to coat the fluoride particles with an Mn-free fluoride,
wherein M is at least one selected from the group consisting of silicon (Si), titanium (Ti), zirconium (Zr), hafnium (Hf), germanium (Ge), and tin (Sn), A is at least one selected from the group consisting of lithium (Li), sodium (Na), potassium (K), rubidium (Rb), and cesium (Cs), a compositional ratio (x) of A satisfies 2≤x≤3, and a compositional ratio (y) of F satisfies 4≤y≤7.

17. The method of claim 16, the second source material is introduced in a saturation solution state or in a powder state.

18. A method of manufacturing a fluoride phosphor, the method comprising:
preparing a hydrofluoric (HF) solution dissolving a first source material containing M and a fluoride containing Mn4+; and
forming fluoride particles by introducing a second source material containing A to the HF solution in each of a plurality of instances,
wherein the fluoride particles have a chemical formula of AxMFy:Mn4+:
a compositional ratio (x) of A satisfies 2≤x≤3; and
a compositional ratio (y) of F satisfies 4≤y≤7,
wherein the forming of the fluoride particles includes:
forming fluoride seeds by a primary introduction of the second source material; and
growing the fluoride seeds to form the fluoride particles by at least one secondary introduction of the second source material, and
wherein an amount of the second source material introduced in the primary introduction ranges from 5 to 30 wt % of a total amount of the second source material.

* * * * *